US012757609B2

(12) United States Patent
Kim et al.

(10) Patent No.: US 12,757,609 B2
(45) Date of Patent: Oct. 6, 2026

(54) DISPLAY DEVICE

(71) Applicant: Samsung Display Co., LTD., Yongin-si (KR)

(72) Inventors: Hyun Ho Kim, Yongin-si (KR); Dong Uk Kim, Yongin-si (KR); Hyoeng Ki Kim, Yongin-si (KR); Hyeon Bum Lee, Yongin-si (KR); Hoon Gi Lee, Yongin-si (KR); Chaun Gi Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 551 days.

(21) Appl. No.: 18/313,430

(22) Filed: May 8, 2023

(65) Prior Publication Data

US 2024/0081124 A1 Mar. 7, 2024

(30) Foreign Application Priority Data

Sep. 7, 2022 (KR) ........................ 10-2022-0113142

(51) Int. Cl.
*H10K 59/80* (2023.01)
*G06F 3/044* (2006.01)
(Continued)

(52) U.S. Cl.
CPC ........... *H10K 59/40* (2023.02); *G06F 3/0446* (2019.05); *H10K 59/122* (2023.02); *H10K 59/38* (2023.02);
(Continued)

(58) Field of Classification Search
CPC ...... H10K 59/40; H10K 59/122; H10K 59/38; H10K 59/873; H10K 59/12; H10K 59/805;
(Continued)

(56) References Cited

U.S. PATENT DOCUMENTS 9,224,980 B2 12/2015 Yamazaki et al.
10,199,608 B2 2/2019 Woo et al.
(Continued)

FOREIGN PATENT DOCUMENTS

CN 112992053 6/2021
CN 113555517 10/2021
(Continued)

OTHER PUBLICATIONS

Jarosz et al., Transparent to Black Electrochromism—The "Holy Grail" of Organic Optoelectronics, Polymers 2019, 11, 273.

*Primary Examiner* — Steven B Gauthier
*Assistant Examiner* — Adam D Weiland
(74) *Attorney, Agent, or Firm* — Innovation Counsel LLP

(57) ABSTRACT

A display device includes a via insulating layer on a substrate; a first electrode on the via insulating layer; a pixel defining layer including an inclined region on the first electrode and including a first opening exposing a portion of the first electrode, and a flat region at a side of the inclined region and in contact with the via insulating layer; a light emitting layer on the portion of the first electrode exposed by the first opening; organic particles on the flat region of the pixel defining layer; an encapsulation layer covering the pixel defining layer, the light emitting layer, and the organic particles, and including a first layer, a second layer, and a third layer; and a first light blocking layer on the third layer of the encapsulation layer to overlap the flat region of the pixel defining layer and form a second opening.

12 Claims, 31 Drawing Sheets

(51) Int. Cl.
*H10K 59/122* (2023.01)
*H10K 59/38* (2023.01)
*H10K 59/40* (2023.01)
*H10K 102/00* (2023.01)

(52) U.S. Cl.
CPC ....... *H10K 59/873* (2023.02); *H10K 59/8792* (2023.02); *H10K 2102/311* (2023.02)

(58) Field of Classification Search
CPC ............. H10K 59/8791; H10K 59/124; H10K 59/00–95; H10K 50/865; H10K 50/805; H10K 50/844; H10K 50/86; H10K 50/11; H10K 50/81; H10K 50/82; H10K 50/8445; H10K 50/00–88; H10K 2102/311; H10K 2102/00–361; H10K 77/10–111; G09F 9/335; G06F 3/0446
See application file for complete search history.

(56) References Cited

U.S. PATENT DOCUMENTS

| | | | | |
|---|---|---|---|---|
| 10,439,009 | B2 | 10/2019 | Bok et al. | |
| 10,985,223 | B2 | 4/2021 | Bok et al. | |
| 11,211,578 | B2 | 12/2021 | Park et al. | |
| 11,594,581 | B2 | 2/2023 | Bok et al. | |
| 12,052,902 | B2 | 7/2024 | Bok et al. | |
| 2012/0217516 | A1* | 8/2012 | Hatano | H10K 59/122 257/E33.062 |
| 2020/0161382 | A1* | 5/2020 | Lee | H10K 59/40 |
| 2022/0038564 | A1* | 2/2022 | Li | G06F 1/1652 |
| 2022/0057876 | A1* | 2/2022 | Song | G06F 3/0446 |
| 2024/0349570 | A1 | 10/2024 | Bok et al. | |

FOREIGN PATENT DOCUMENTS

| | | | |
|---|---|---|---|
| JP | 2014-209480 | A | 11/2014 |
| KR | 10-1789586 | | 10/2017 |
| KR | 10-2018-0077439 | | 7/2018 |
| KR | 10-2018-0125674 | A | 11/2018 |
| KR | 10-2019-0016631 | | 2/2019 |
| KR | 10-2047006 | | 12/2019 |
| KR | 10-2020-0042996 | | 4/2020 |
| KR | 10-2021-0134886 | A | 11/2021 |
| KR | 10-2022-0022528 | | 2/2022 |
| KR | 10-2387859 | | 4/2022 |

* cited by examiner

ASHING

100_9: AA, NAA, SBA_9
AA: AA1, AA2, AA3
NAA: DM, BZ
SP: SG, MPL
BZ: BZ1, BZ2
BZ1: BZ1a, BZ1b, BZ1c
BZ2: BZ2a, BZ2b, BZ2c
DM: DM1, DM2

DISPLAY DEVICE

CROSS-REFERENCE TO RELATED APPLICATION(S)

This application claims priority to and benefits of Korean Patent Application No. 10-2022-0113142 under 35 U.S.C. § 119, filed on Sep. 7, 2022, in the Korean Intellectual Property Office, the entire contents of which are incorporated herein by reference.

BACKGROUND

1. Technical Field

Embodiments relate to a display device.

2. Description of the Related Art

With the advance of information-oriented society, more and more demands are placed on display devices for displaying images in various ways. For example, display devices are implemented in various electronic devices such as smartphones, digital cameras, laptop computers, navigation devices, and smart televisions.

The display device may be a flat panel display device such as a liquid crystal display device, a field emission display device and an organic light emitting display device. Among the flat panel display devices, in the light emitting display device, since each of pixels of a display panel includes a light emitting element capable of emitting light by itself, an image is displayed without a backlight unit providing light to the display panel.

As a method of improving the contrast of the OLED device without using a polarizing film, there is a method of reducing external light reflection by forming a color filter and a light blocking portion as an encapsulation layer of the OLED device. The light blocking portion includes a plurality of openings corresponding to a plurality of pixels, and the color filter is disposed to overlap the plurality of openings. The OLED device may be slimmed down because it does not need to use a polarizing film.

SUMMARY

Embodiments provide a display device capable of improving external light reflectance.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include: a via insulating layer disposed on a first surface of a substrate; a first electrode disposed on the via insulating layer; a pixel defining layer including an inclined region disposed on the first electrode and including a first opening exposing a portion of the first electrode, and a flat region disposed at a side of the inclined region and in contact with the via insulating layer; a light emitting layer disposed on the portion of the first electrode exposed by the first opening; organic particles disposed on the flat region of the pixel defining layer; an encapsulation layer covering the pixel defining layer, the light emitting layer, and the organic particles, and including a first layer, a second layer, and a third layer which are sequentially stacked; and a first light blocking layer disposed on the third layer of the encapsulation layer to overlap the flat region of the pixel defining layer and form a second opening, wherein the second layer of the encapsulation layer may be disposed between the first layer and the third layer and may overlap the second opening, and the first layer and the third layer of the encapsulation layer may be in contact with each other and may overlap the first light blocking layer.

The display device of claim may further comprise a second electrode disposed between the first layer of the encapsulation layer and the light emitting layer, wherein the organic particles penetrate the second electrode and the first layer.

The third layer may surround the organic particles.

The organic particles and the light emitting layer may include a same material.

A width of the second opening may be greater than a width of the first opening.

The display device may further comprise a first overcoat layer disposed on the first light blocking layer; and a touch electrode layer disposed on the first overcoat layer. A dielectric constant of the first overcoat layer may have a value lower than a dielectric constant of the second layer of the encapsulation layer.

The display device may further comprise a second light blocking layer disposed on the touch electrode layer and including a third opening; and a color filter covering the third opening. A width of the third opening may be greater than the width of the second opening.

The touch electrode layer may comprise a touch electrode, and the second light blocking layer overlaps the touch electrode.

The pixel defining layer may include a light blocking material.

The second layer of the encapsulation layer may comprise a first material layer and a second material layer which are alternately and repeatedly disposed.

One of the first material layer and the second material layer may include silicon oxycarbide (SiOC), and another one of the first material layer and the second material layer may include silicon nitride (SiNx).

The substrate may be configured to slides in a first direction, and the display device may further comprise a plurality of segments extending in a second direction intersecting the first direction and disposed on a second surface opposite to the first surface of the substrate.

According to an embodiment, a display device may include: a via insulating layer disposed on a substrate; a first electrode disposed on the via insulating layer and including a recessed portion recessed in a direction toward the via insulating layer; a pixel defining layer disposed on the first electrode and including a first opening exposing the recessed portion of the first electrode; a light emitting layer disposed on the recessed portion of the first electrode; an encapsulation layer covering the pixel defining layer and the light emitting layer; and a first light blocking member disposed on the encapsulation layer and including a second opening, wherein the recessed portion of the first electrode comprises: an inclined portion providing an inclined surface; and a flat portion disposed at a side of the inclined portion and including a flat surface, wherein the first light blocking member may overlap at least a part of the inclined portion of the first electrode.

A width of the second opening may be smaller than a width of the first opening.

The first opening may include: a first sub-emission area overlapping the inclined portion of the first electrode; and a first main emission area overlapping the flat portion of the first electrode. A width of the second opening may be equal to a width of the first main emission area of the first opening.

The second opening may overlap the first main emission area.

The pixel defining layer may include a transparent organic material.

According to an embodiment, a display device may include: a via insulating layer disposed on a substrate; a first electrode disposed on the via insulating layer; a pixel defining layer including an inclined region disposed on the first electrode and including a first opening exposing a portion of the first electrode, and a flat region disposed at a side of the inclined region and in contact with the via insulating layer; a light emitting layer disposed in the first opening; an encapsulation layer covering the pixel defining layer and the light emitting layer, and including a first layer, a second layer, and a third layer which are sequentially stacked; and a first light blocking layer disposed on the third layer of the encapsulation layer, wherein the second layer of the encapsulation layer may be disposed between the first layer and the third layer and may overlap the first opening, the first layer and the third layer of the encapsulation layer are in contact and may overlap the first light blocking layer, and the first light blocking layer may cover the flat region of the pixel defining layer, and may cover at least a part of the inclined region of the pixel defining layer.

The display device may further comprise a first overcoat layer disposed on the first light blocking layer; and a touch electrode layer disposed on the first overcoat layer. A dielectric constant of the first overcoat layer may have a value lower than a dielectric constant of the second layer of the encapsulation layer.

The display device may further comprise a second light blocking layer disposed on the touch electrode layer and including a third opening; and a color filter covering the third opening. The touch electrode layer may comprise a touch electrode, and the second light blocking layer may overlap the touch electrode.

The display device according to an embodiment may have improved external light reflectance.

However, effects according to the embodiments of the present disclosure are not limited to those above and various other effects are incorporated herein.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
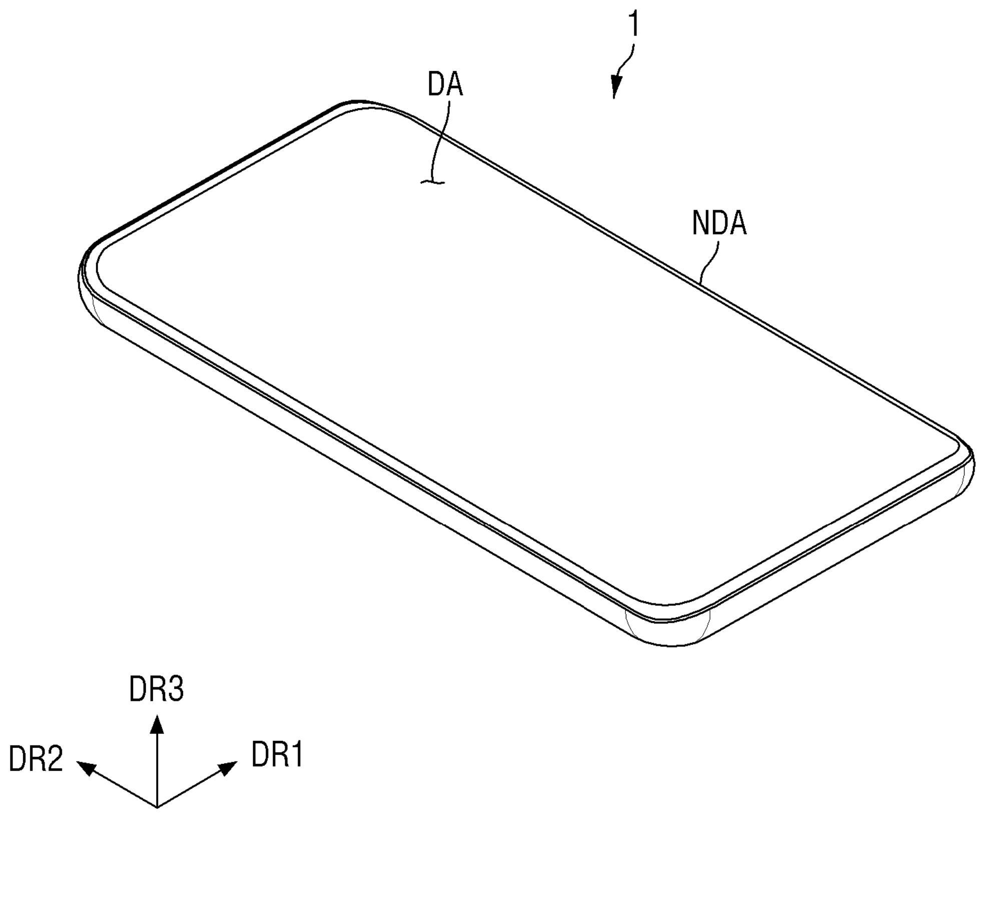
FIG. 1 is a schematic perspective view of an electronic device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z—axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described in detail with reference to the accompanying drawings.

FIG. 1 is a schematic perspective view of an electronic device according to an embodiment.

Referring to FIG. 1, an electronic device 1 may display a moving image or a still image. The electronic device 1 may refer to any electronic device providing a display screen.

Examples of the electronic device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which include a display screen.

A first direction DR1, a second direction DR2, and a third direction DR3 are defined as shown in FIG. 1. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an upward and downward direction (e.g., a thickness direction) in the drawing. In the following specification, unless otherwise stated, "direction" may refer to both of directions extending along the direction. Further, when it is necessary to distinguish "directions" extending in sides (e.g., opposite sides), a side will be referred to as "a side in the direction" and another side will be referred to as "another side in the direction." Referring to FIG. 1, a direction in which an arrow indicating a direction is directed is referred to as a side, and an opposite direction thereto is referred to as another side.

Hereinafter, for simplicity of description, when referring to an electronic device 1 or the surfaces of each member forming the electronic device 1, a surface facing to a side in the direction in which the image is displayed, e.g., the third direction DR3 is referred to as a top surface, and the opposite surface of the surface is referred to as a bottom surface. However, embodiments are not limited thereto, and the surface and another surface of the member may be referred to as a front surface and a rear surface, respectively, or may also be referred to as a first surface or a second surface. In describing the relative position of each of the members of the electronic device 1, a side of the third direction DR3 may be referred to as an upper side and another side of the third direction DR3 may be referred to as a lower side.

Figure 2:
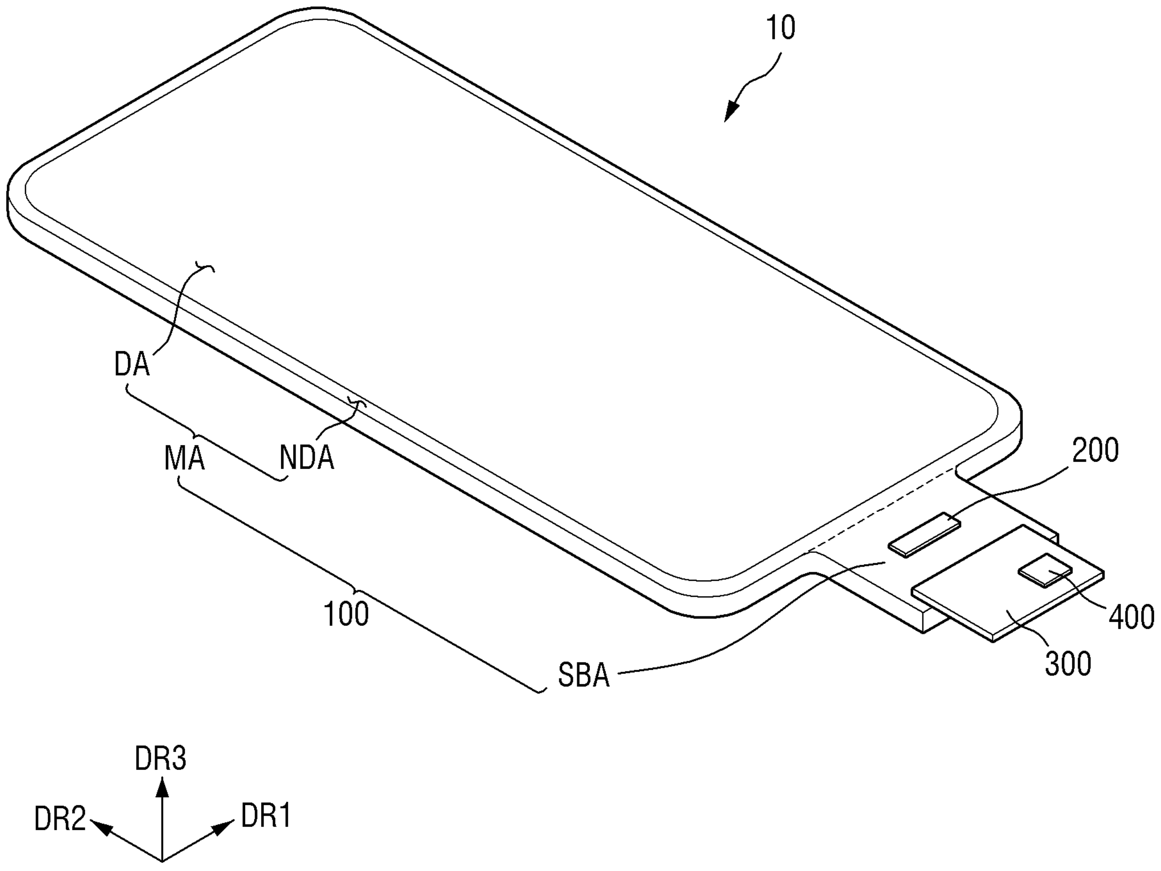
FIG. 2 is a schematic perspective view illustrating a display device included in an electronic device according to an embodiment.

The electronic device 1 may include a display device 10 in FIG. 2 including a display screen. Examples of the display device may include an inorganic light emitting diode display device, an organic light emitting display device, a quantum dot light emitting display device, a plasma display device and a field emission display device. In the following description, a case where an organic light emitting diode display device is applied as a display device will be described, but embodiments are not limited thereto, and other display devices may be applied within the same scope of technical spirit.

The shape of the electronic device 1 may be variously modified. For example, the electronic device 1 may have a shape such as a rectangular shape elongated in a horizontal direction, a rectangular shape elongated in a vertical direction, a square shape, a quadrilateral shape with rounded corners (vertices), other polygonal shapes and a circular shape. The shape of a display area DA of the electronic device 1 may also be similar to the overall shape of the electronic device 1. FIG. 1 illustrates the electronic device 1 having a rectangular shape elongated in a second direction DR2.

The electronic device 1 may include the display area DA and a non-display area NDA. The display area DA may be an area where an image is displayed, and the non-display area NDA may be an area where an image is not displayed. The display area DA may also be referred to as an active region, and the non-display area NDA may also be referred to as a non-active region. The display area DA may substantially occupy the center portion of the electronic device 1.

FIG. 2 is a perspective view illustrating a display device included in an electronic device according to an embodiment.

Referring to FIG. 2, the electronic device 1 according to an embodiment may include a display device 10. The display device 10 may provide an image displayed by the electronic device 1. The display device 10 may have a planar shape similar to the shape of the electronic device 1. For example, the display device 10 may have a shape similar to a rectangular shape having a short side in the first direction DR1 and a long side in the second direction DR2. The edge where the short side in the first direction DR1 and the long side in the second direction DR2 meet may be rounded to have a curvature, but embodiments are not limited thereto and may be formed at a right angle. The planar shape of the display device 10 is not limited to a quadrilateral shape, and may be formed in a shape similar to another polygonal shape, a circular shape, or elliptical shape.

The display device 10 may include the display panel 100, the display driver 200, the circuit board 300, and the touch driver 400.

The display panel 100 may include a main region MA and a sub-region SBA.

The main region MA may include the display area DA including pixels displaying an image and the non-display area NDA disposed around the display area DA. The display area DA may emit light from opening areas or emission areas to be described below. For example, the display panel 100 may include a pixel circuit including switching elements, a pixel defining layer defining an emission area or an opening area, and a self-light emitting element.

For example, the self-light emitting element may include at least one of an organic light emitting diode (LED) including an organic light emitting layer, a quantum dot LED including a quantum dot light emitting layer, an inorganic LED including an inorganic semiconductor, or a micro LED, but embodiments are not limited thereto. In the following drawings, a case where the self-light emitting element is an organic light emitting diode is illustrated by way of example.

The non-display area NDA may be an area outside the display area DA. The non-display area NDA may be defined as an edge area of the main region MA of the display panel 100. The non-display area NDA may include a gate driver that supplies gate signals to the gate lines, and fan-out lines that connect the display driver 200 to the display area DA.

The sub-region SBA may be a region extending from a side of the main region MA. The sub-region SBA may include a flexible material which is bendable, foldable, or rollable. For example, in case that the sub-region SBA is bent, the sub-region SBA may overlap the main region MA in a thickness direction (third direction DR3). The sub-region SBA may include the display driver 200 and the pad unit connected to the circuit board 300. In another embodiment, the sub-region SBA may be omitted, and the display driver 200 and the pad unit may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may overlap the main region MA in the thickness direction by bending of the sub-region SBA. For another example, the display driver 200 may be mounted on the circuit board 300.

The circuit board 300 may be attached to the pad unit of the display panel 100 by using an anisotropic conductive film (ACF). Lead lines of the circuit board 300 may be electrically connected to a pad unit of the display panel 100. The circuit board 300 may be a flexible printed circuit board, a printed circuit board, or a flexible film such as a chip on film.

A touch driver 400 may be mounted on the circuit board 300. The touch driver 400 may be connected to a touch sensing unit of the display panel 100. The touch driver 400 may supply a touch driving signal to touch electrodes of the touch sensing unit and may sense an amount of change in capacitance between the touch electrodes. For example, the touch driving signal may be a pulse signal having a predetermined frequency. The touch driver 400 may calculate whether an input is made and input coordinates based on an amount of change in capacitance between the touch electrodes. The touch driver 400 may be formed of an integrated circuit (IC).

Figure 3:
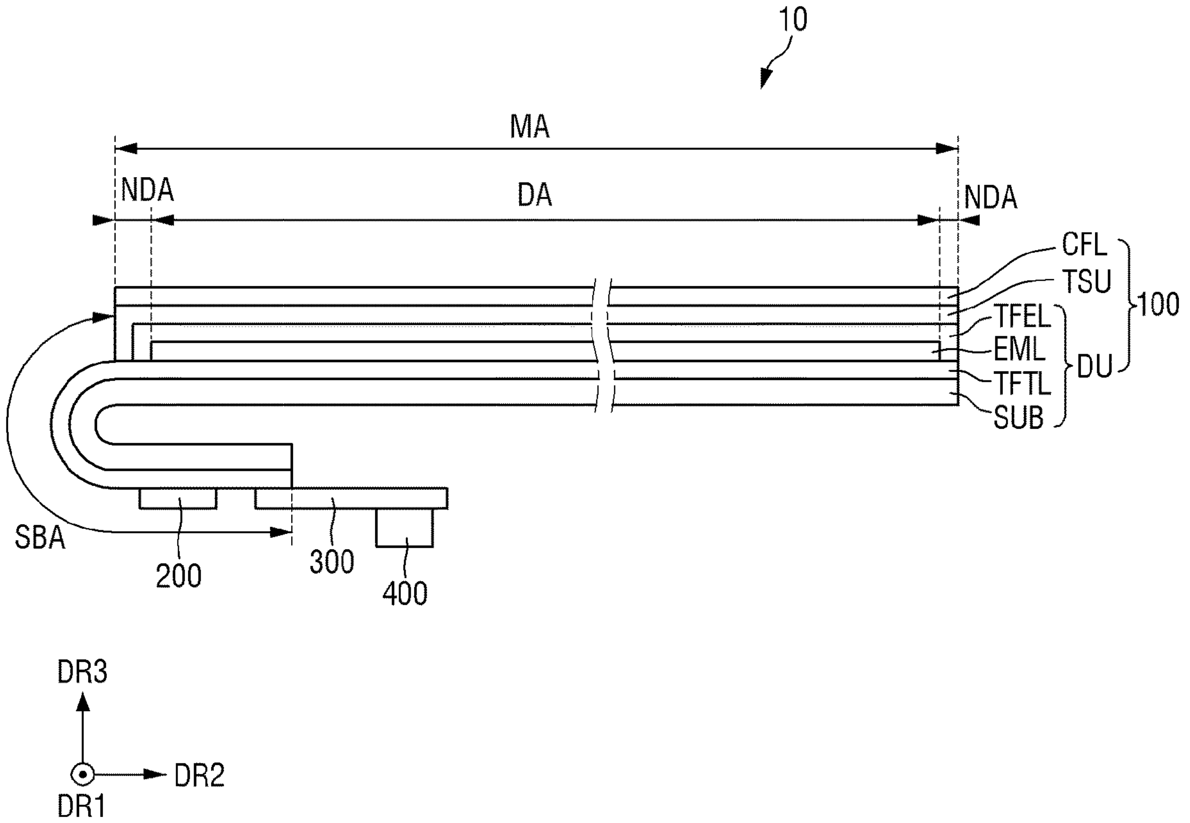
FIG. 3 is a schematic cross-sectional view of the display device of FIG. 2 viewed from the side.

FIG. 3 is a schematic cross-sectional view of the display device of FIG. 2 viewed from the side.

Referring to FIG. 3, the display panel 100 may include a display layer DU, a touch sensing layer TSU, and a color filter layer CFL. The display layer DU may include the substrate SUB, the thin film transistor layer TFTL, the light emitting element layer EML, and the encapsulation layer TFEL.

The substrate SUB may be a base substrate or a base member. The substrate SUB may be a flexible substrate which is bendable, foldable, or rollable. For example, the substrate SUB may include a polymer resin such as polyimide (PI), but embodiments are not limited thereto. In another embodiment, the substrate SUB may include a glass material or a metal material.

The thin film transistor layer TFTL may be disposed on the substrate SUB. The thin film transistor layer TFTL may include thin film transistors forming a pixel circuit of pixels. The thin film transistor layer TFTL may further include gate lines, data lines, power lines, gate control lines, fan-out lines that connect the display driver 200 to the data lines, and lead lines that connect the display driver 200 to the pad unit. Each of the thin film transistors may include a semiconductor region, a source electrode, a drain electrode, and a gate electrode. For example, in case that the gate driver is formed on a side of the non-display area NDA of the display panel 100, the gate driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include light emitting elements each including a first electrode, a second electrode, and a light emitting layer to emit light, and a pixel defining layer defining pixels. The light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. In case that the first electrode receives a voltage through the thin film transistor of the thin film transistor layer TFTL and the second electrode receives the cathode voltage, holes and electrons may be transferred to the organic light emitting layer through the hole transporting layer and the electron transporting layer, respectively and may be combined with each other to emit light in the organic light emitting layer.

In another embodiment, the light emitting elements may include a quantum dot light emitting diode including a quantum dot light emitting layer, an inorganic light emitting diode including an inorganic semiconductor, or a micro light emitting diode.

The encapsulation layer TFEL may cover the top surface and the side surface of the light emitting element layer EML, and may protect the light emitting element layer EML. In some embodiments, the encapsulation layer TFEL may include at least one inorganic layer and at least one organic layer for encapsulating the light emitting element layer EML.

The touch sensing layer TSU may be disposed on the encapsulation layer TFEL. The touch sensing layer TSU may include touch electrodes for sensing a user's touch in a capacitive manner, and touch lines connecting the touch electrodes to the touch driver 400. For example, the touch sensing layer TSU may sense the user's touch by using a mutual capacitance method or a self-capacitance method.

In another embodiment, the touch sensing layer TSU may be disposed on a separate substrate disposed on the display layer DU. For example, the substrate supporting the touch sensing layer TSU may be a base member that encapsulates the display layer DU.

The touch electrodes of the touch sensing layer TSU may be disposed in a touch sensor area overlapping the display area DA. The touch lines of the touch sensing layer TSU may be disposed in a touch peripheral area that overlaps the non-display area NDA.

The color filter layer CFL may be disposed on the touch sensing layer TSU. The color filter layer CFL may include color filters respectively corresponding to (or overlapping) the emission areas. Each of the color filters may selectively transmit light of a specific wavelength and may block or absorb light of a different wavelength. The color filter layer CFL may absorb a part of light coming from the outside of the display device 10 to reduce reflected light due to external light. Accordingly, the color filter layer CFL may prevent color distortion caused by reflection of the external light.

Since the color filter layer CFL is directly disposed on the touch sensing layer TSU, the display device 10 may not require a separate substrate for the color filter layer CFL. Therefore, the thickness of the display device 10 may be relatively small.

Figure 4:
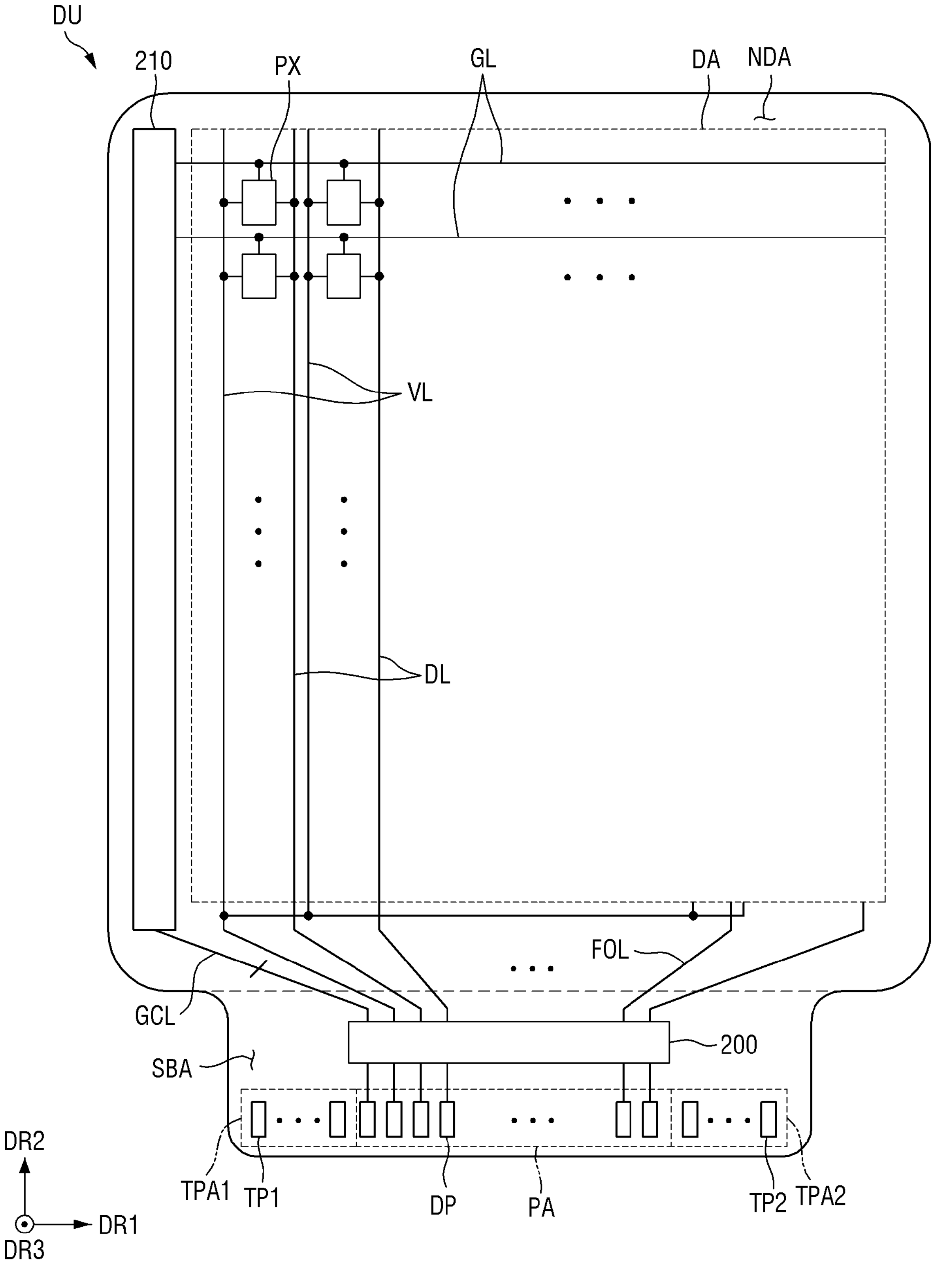
FIG. 4 is a schematic plan view illustrating a display layer of a display device according to an embodiment.

FIG. 4 is a plan view illustrating a display layer of a display device according to an embodiment.

Referring to FIG. 4, the display layer DU may include the display area DA and the non-display area NDA.

The display area DA may be disposed at the center portion of the display panel 100. In the display area DA, pixels PX, gate lines GL, data lines DL, and power lines VL may be disposed. Each of the pixels PX may be defined as the smallest unit that emits light.

The gate lines GL may supply the gate signals received from a gate driver 210 to the pixels PX. The gate lines GL may extend in the first direction DR1 and may be spaced apart from each other in the second direction DR2 intersecting the first direction DR1.

The display device 10 according to an embodiment may further include light emitting lines that provide a voltage necessary for light emission of each pixel PX. The light emitting lines may extend in the first direction DR1, may be spaced apart from each other in the second direction DR2 intersecting the first direction DR1, and may transmit a light emitting signal received from the gate driver 210 to the pixels PX.

The data lines DL may supply the data voltages received from the display driver 200 to the pixels PX. The data lines DL may extend in the second direction DR2 and may be spaced apart from each other in the first direction DR1.

The power lines VL may supply the power voltage received from the display driver 200 to the pixels PX. For example, the power voltage may be at least one of a driving voltage, an initialization voltage, a reference voltage, or a low potential voltage. The power lines VL may extend in the second direction DR2 and may be spaced apart from each other in the first direction DR1.

The non-display area NDA may surround the display area DA. A gate driver 210, fan-out lines FOL, and gate control lines GCL may be disposed in the non-display area NDA. The gate driver 210 may generate gate signals based on the gate control signal, and may sequentially supply the gate signals to the gate lines GL according to a set order.

The fan-out lines FOL may extend from the display driver 200 to the display area DA. The fan-out lines FOL may supply the data voltage received from the display driver 200 to the data lines DL.

The gate control line GCL may extend from the display driver 200 to the gate driver 210. The gate control line GCL may supply the gate control signal received from the display driver 200 to the gate driver 210.

The sub-region SBA may include the display driver 200, a pad area PA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the pixels PX, and the luminance of the pixels PX may be controlled. The display driver 200 may supply the gate control signal to the gate driver 210 through the gate control line GCL.

The pad area PA, the first touch pad area TPA1, and the second touch pad area TPA2 may be disposed at the edge of the sub-region SBA. The pad area PA, the first touch pad area TPA1, and the second touch pad area TPA2 may be electrically connected to the circuit board 300 by using a material such as self-assembly anisotropic conductive paste (SAP) or an anisotropic conductive film.

The pad area PA may include display pad units DP. The display pad units DP may be connected to a graphic system through the circuit board 300. The display pad units DP may be connected to the circuit board 300 to receive digital video data, and may supply the digital video data to the display driver 200.

Figure 5:
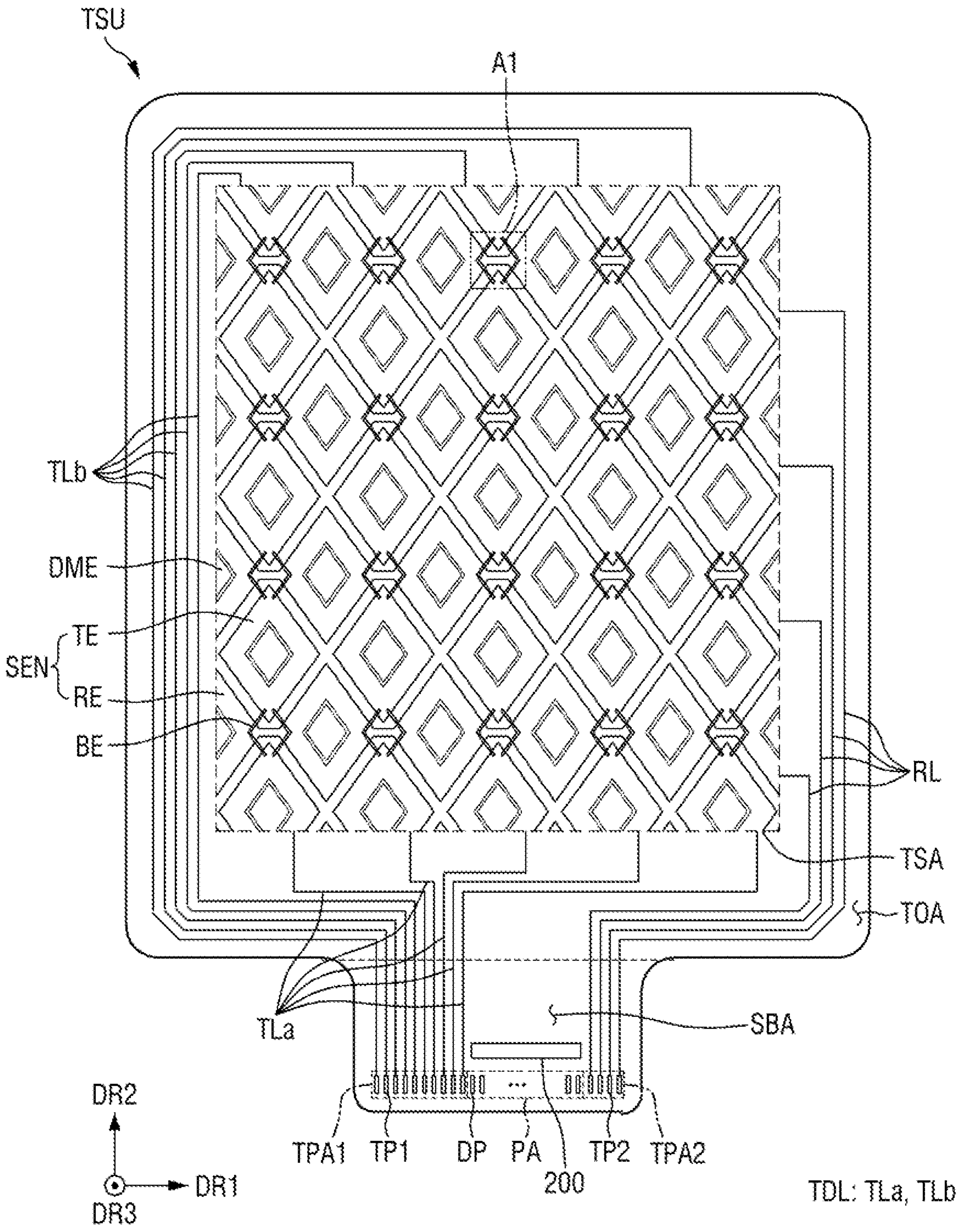
FIG. 5 is a schematic plan view illustrating a touch sensing layer of a display device according to an embodiment.

FIG. 5 is a plan view illustrating a touch sensing layer of a display device according to an embodiment.

Referring to FIG. 5, the touch sensing layer TSU may include a touch sensor area TSA for sensing a user's touch, and a touch peripheral area TOA disposed around the touch sensor area TSA. The touch sensor area TSA may be disposed in the display area DA of the display device 10, and the touch peripheral area TOA may be disposed in the non-display area NDA of the display device 10.

The touch sensor area TSA may include touch electrodes SEN and dummy electrodes DME. The touch electrodes SEN may form mutual capacitance or self-capacitance to sense a touch of an object or a person. The touch electrodes SEN may include driving electrodes TE and sensing electrodes RE.

The driving electrodes TE may be arranged in the first direction DR1 and the second direction DR2. The driving electrodes TE may be spaced apart from each other in the first direction DR1 and the second direction DR2. The driving electrodes TE adjacent in the second direction DR2 may be electrically connected through a bridge electrode BE.

The driving electrodes TE may be connected to a first touch pad unit TP1 through a driving line TDL. The driving line TDL may include a lower driving line TLa and an upper driving line TLb. For example, the driving electrodes TE disposed under the touch sensor area TSA may be connected to the first touch pad unit TP1 through the lower driving line TLa, and the driving electrodes TE disposed on the upper side of the touch sensor area TSA may be connected to the first touch pad unit TP1 through the upper driving line TLb. The lower driving line TLa may extend to the first touch pad unit TP1 through the lower side of the touch peripheral area TOA. The upper driving line TLb may extend to the first touch pad unit TP1 through the upper side, the left side, and the lower side of the touch peripheral area TOA. The first touch pad unit TP1 may be connected to the touch driver 400 through the circuit board 300.

The bridge electrode BE may be bent at least once. For example, the bridge electrode BE may have an angle bracket shape ("<" or ">"), but the planar shape of the bridge electrode BE is not limited thereto. The driving electrodes TE adjacent to each other in the second direction (e.g., Y-axis direction) may be connected by bridge electrodes BE, and although any one of the bridge electrodes BE is disconnected, the driving electrodes TE may be stably connected through the remaining bridge electrode BE. The driving electrodes TE adjacent to each other may be connected by two bridge electrodes BE, but the number of bridge electrodes BE is not limited thereto.

The bridge electrode BE may be disposed on a different layer from the driving electrodes TE and the sensing electrodes RE. The sensing electrodes RE adjacent to each other in the first direction DR1 may be electrically connected through a connection portion disposed on the same layer as the driving electrodes TE or the sensing electrodes RE, and the driving electrodes TE adjacent in the second direction DR2 may be electrically connected through the bridge electrode BE disposed on a different layer from the driving electrodes TE or the sensing electrodes RE. Accordingly, although the bridge electrode BE overlaps the sensing electrodes RE in the Z-axis direction, the driving electrodes TE and the sensing electrodes RE may be insulated from each other. Mutual capacitance may be formed between the driving electrode TE and the sensing electrode RE.

The sensing electrodes RE may extend in the first direction DR1 and may be spaced apart from each other in the second direction DR2. The sensing electrodes RE may be arranged in the first direction DR1 and the second direction DR2, and the sensing electrodes RE adjacent in the first direction DR1 may be electrically connected through the connection portion.

The sensing electrodes RE may be connected to a second touch pad unit TP2 through a sensing line RL. For example, the sensing electrodes RE disposed on the right side of the touch sensor area TSA may be connected to the second touch pad unit TP2 through the sensing line RL. The sensing line RL may extend to the second touch pad unit TP2 through the right side and the lower side of the touch peripheral area TOA. The second touch pad unit TP2 may be connected to the touch driver 400 through the circuit board 300.

Each of the dummy electrodes DME may be surrounded by the driving electrode TE or the sensing electrode RE. Each of the dummy electrodes DME may be insulated by being spaced apart from the driving electrode TE or the sensing electrode RE. Accordingly, the dummy electrode DME may be electrically floating.

The pad area PA, the first touch pad area TPA1, and the second touch pad area TPA2 may be disposed at the edge of the sub-region SBA. The pad area PA, the first touch pad area TPA1, and the second touch pad area TPA2 may be electrically connected to the circuit board 300 by using a low-resistance high-reliability material such as self-assembly anisotropic conductive paste (SAP) or an anisotropic conductive film.

The first touch pad area TPA1 may be disposed on a side of the pad area PA, and may include first touch pad units TP1. The first touch pad units TP1 may be electrically connected to the touch driver 400 disposed on the circuit board 300. The first touch pad units TP1 may supply a touch driving signal to the driving electrodes TE through driving lines TDL.

The second touch pad area TPA2 may be disposed on another side of the pad area PA, and may include second touch pad units TP2. The second touch pad units TP2 may be electrically connected to the touch driver 400 disposed on the circuit board 300. The touch driver 400 may receive a touch sensing signal through sensing lines RL connected to the second touch pad units TP2, and may sense a change in mutual capacitance between the driving electrode TE and the sensing electrode RE.

In another embodiment, the touch driver 400 may supply a touch driving signal to each of the driving electrodes TE and the sensing electrodes RE, and may receive a touch sensing signal from each of the driving electrodes TE and the sensing electrodes RE. The touch driver 400 may sense an amount of change in electric charge of each of the driving electrodes TE and the sensing electrodes RE based on the touch sensing signal.

Figure 6:
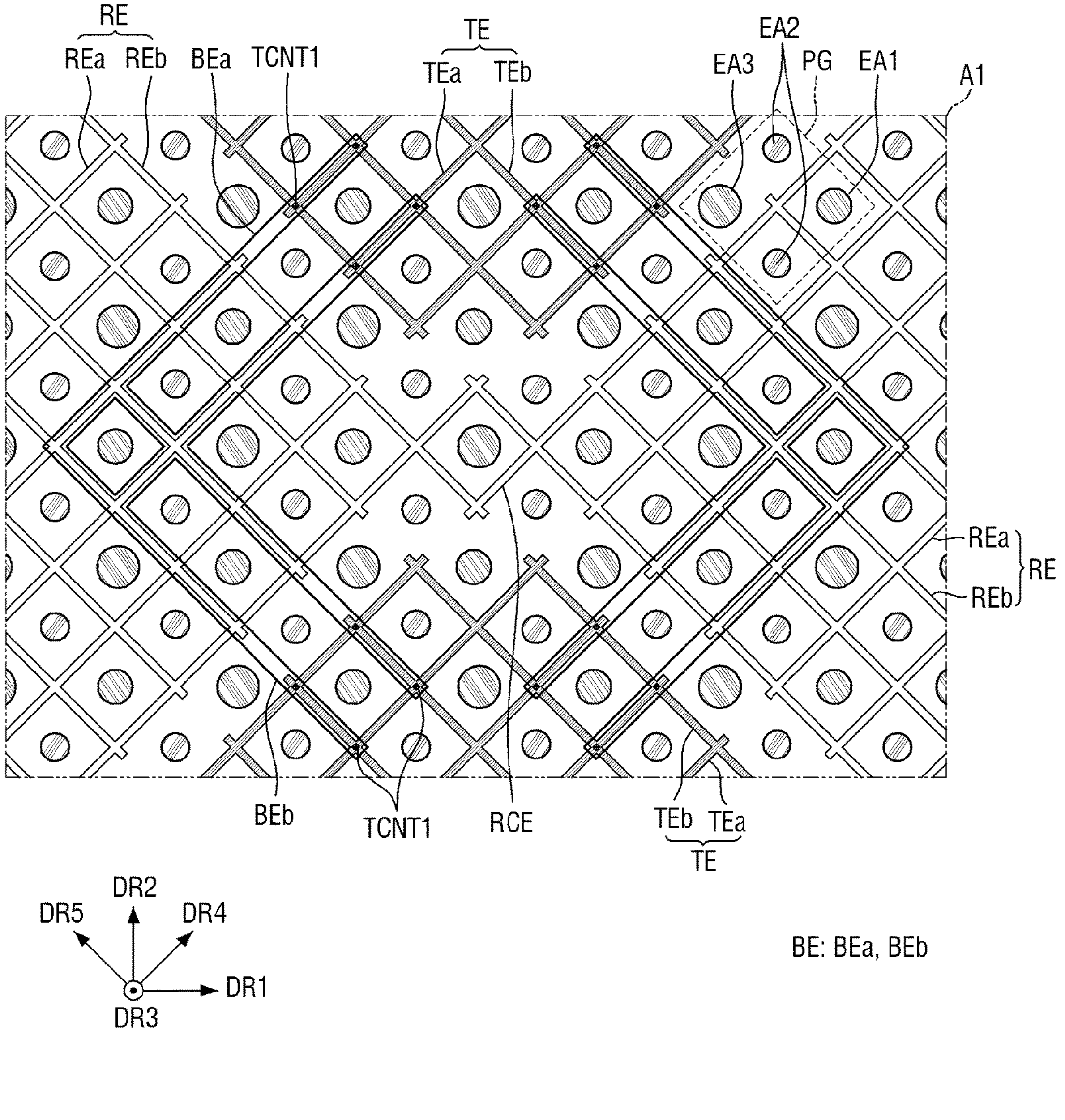
FIG. 6 is a schematic enlarged view of area A1 of FIG. 5.

FIG. 6 is a schematic enlarged view of area A1 of FIG. 5.

Referring to FIG. 6, the touch sensing layer TSU may be a touch electrode SEN and may include the driving electrodes TE, the sensing electrodes RE, and the dummy electrodes DME that is disposed on the same layer with being spaced apart from each other. Also, the touch sensing layer TSU may include bridge electrodes BE disposed under the driving electrodes TE, the sensing electrodes RE, and the dummy electrodes DME.

The driving electrodes TE may be arranged in the first direction DR1 and the second direction DR2. The driving electrodes TE may be spaced apart from each other in the first direction DR1 and the second direction DR2. The driving electrodes TE adjacent in the second direction DR2 may be electrically connected through a bridge electrode BE.

The sensing electrodes RE may extend in the first direction DR1 and may be spaced apart from each other in the second direction DR2. The sensing electrodes RE may be arranged in the first direction DR1 and the second direction DR2, and the sensing electrodes RE adjacent in the first direction DR1 may be electrically connected through the connection portion RCE. For example, the connection portion RCE of the sensing electrodes RE may be disposed within the shortest distance between the driving electrodes TE adjacent to each other.

The bridge electrodes BE may be disposed on a different layer from the driving electrode TE and the sensing electrode RE. The bridge electrode BE may include a first portion BEa and a second portion BEb. For example, the first portion BEa of the bridge electrode BE may be connected to the driving electrode TE disposed on a side through a first touch contact hole TCNT1 and extend in a third direction DR3. The second portion BEb of the bridge electrode BE may be bent from the first portion BEa in an area overlapping the sensing electrode RE to extend in a second direction DR2, and may be connected to the driving electrode TE disposed on another side through the first touch contact hole TCNT1. Accordingly, each of the bridge electrodes BE may electrically connect the adjacent driving electrodes TE in the second direction DR2.

In FIG. 6, a fourth direction DR4 and a fifth direction DR5 are additionally defined. The fourth direction DR4 may be a direction between a side in the first direction DR1 and a side in the second direction DR2, and the fifth direction DR5 may be a direction between another side in the first direction DR1 and the side in the second direction DR2.

Each of the driving electrodes TE may include a first portion TEa extending in the fourth direction DR4 and a second portion TEb extending in the fifth direction DR5. Each of the sensing electrodes RE may include a first portion REa extending in the fourth direction DR4 and a second portion REb extending in the fifth direction DR5.

In some embodiments, the driving electrodes TE, the sensing electrodes RE, and the dummy electrodes DME may be formed in a planar mesh structure or a mesh structure. The driving electrodes TE, the sensing electrodes RE, and the dummy electrodes DME may surround each of first to third emission areas EA1, EA2, and EA3 of a pixel group PG in plan view. Accordingly, the driving electrodes TE, the sensing electrodes RE, and the dummy electrodes DME may not overlap first to third emission areas EA1, EA2, and EA3. The bridge electrodes BE may also not overlap the first to third emission areas EA1, EA2, and EA3. Accordingly, the display device 10 may prevent the luminance of light emitted from the first to third emission areas EA1, EA2, and EA3 from being reduced by the touch sensing layer TSU.

The pixels may include first to third pixels, and each of the first to third pixels may include the first to third emission areas EA1, EA2, and EA3. For example, the first emission area EA1 may emit light of a first color or blue light, the second emission area EA2 may emit light of a second color or green light, and the third emission area EA3 may emit light of a third color or red light, but embodiments are not limited thereto.

One pixel group PG may represent white gray scale by including one first emission area EA1, two second emission areas EA2, and one third emission area EA3, but the configuration of the pixel group PG is not limited thereto. The white gray scale may be represented by a combination of light emitted from the first emission area EA1, light emitted from the second emission area EA2, and light emitted from the third emission area EA3.

The first to third emission areas EA1, EA2, and EA3 may be different in size from each other. For example, the size of the first emission area EA1 may be larger than that of the third emission area EA3, and the size of the third emission area EA3 may be larger than that of the second emission area EA2. However, embodiments are not limited thereto. In some embodiments, the sizes of the first to third emission areas EA1, EA2, and EA3 may be the same as each other.

FIG. 6 illustrates that the first to third emission areas EA1, EA2, and EA3 have a circular shape in plan view, but embodiments are not limited thereto. In some embodiments, the planar shape of the first to third emission areas EA1, EA2, and EA3 may be substantially octagonal. In another embodiment, the planar shape of the first to third emission areas EA1, EA2, and EA3 may be a rhombus, other polygons, a polygon with rounded corners, or the like.

Figure 7:
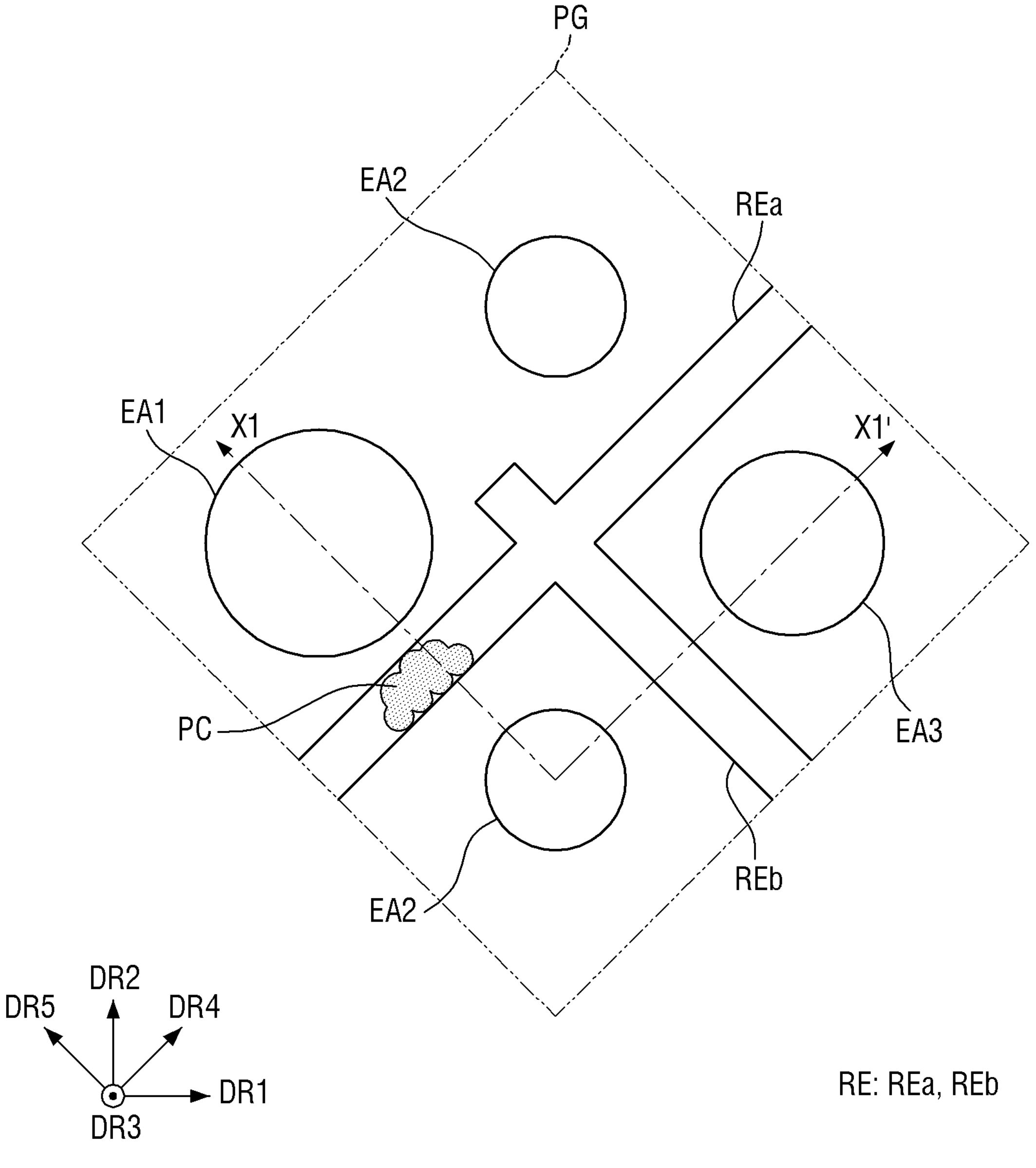
FIG. 7 is a schematic enlarged view of a pixel group of a display device according to an embodiment.
Figure 8:
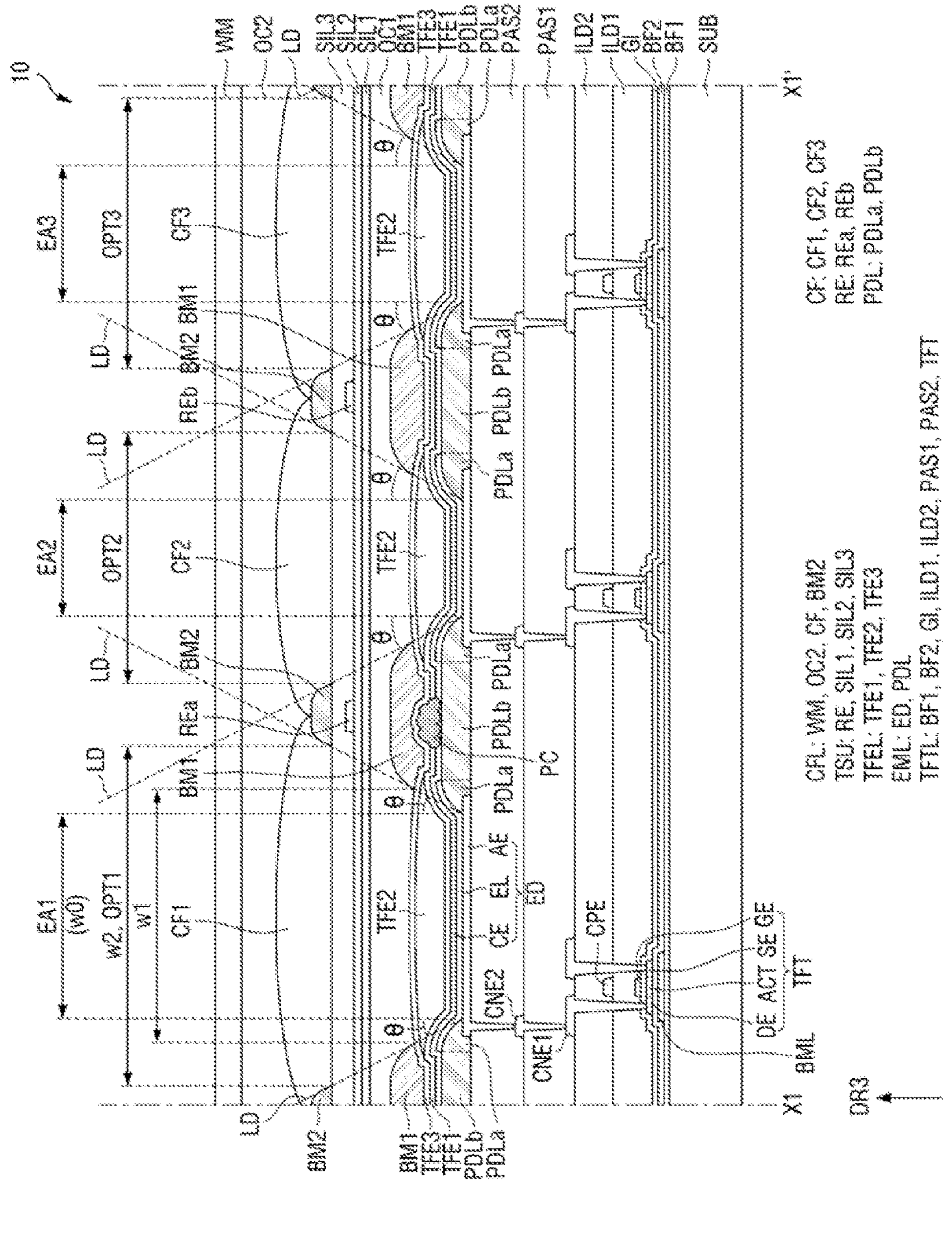
FIG. 8 is a schematic cross-sectional view showing a schematic cross section taken along line X1-X1' of FIG. 7.
Figure 9:
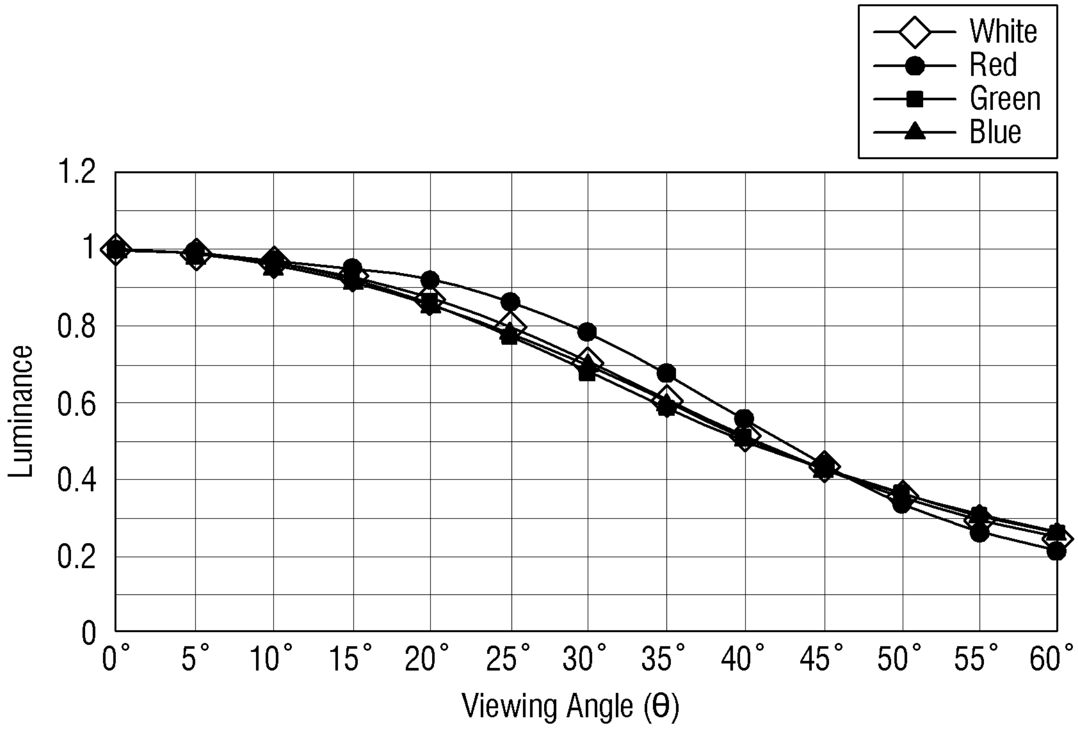
FIG. 9 is a graph for describing a correlation between a viewing angle and a luminance.

FIG. 7 is a schematic enlarged view of a pixel group of a display device according to an embodiment. FIG. 8 is a schematic cross-sectional view showing a schematic cross section taken along line X1-X1' of FIG. 7. FIG. 9 is a graph for describing a correlation between a viewing angle and a luminance.

A cross-sectional structure of the display device 10 will be described with reference to FIGS. 7 and 8. The display panel 100 of the display device 10 may include the display layer DU, the touch sensing layer TSU, and the color filter layer CFL. The display layer DU may include the substrate SUB, the thin film transistor layer TFTL, the light emitting element layer EML, and the encapsulation layer TFEL. Further, the display panel 100 may include a first light blocking layer BM1 disposed on the encapsulation layer TFEL and a second light blocking layer BM2 disposed on the touch sensing layer TSU.

The substrate SUB may be a base substrate or a base member. The substrate SUB may be a flexible substrate which is bendable, foldable, or rollable. For example, the substrate SUB may include a polymer resin such as polyimide (PI), but embodiments are not limited thereto. For another example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing penetration (or permeation) of air or moisture. For example, the first buffer layer BF1 may include inorganic layers alternately stacked.

The lower metal layer BML may be disposed on the first buffer layer BF1. For example, the lower metal layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second buffer layer BF2 may cover the first buffer layer BF1 and the lower metal layer BML. The second buffer layer BF2 may include an inorganic layer capable of preventing penetration of air or moisture. For example, the second buffer layer BF2 may include inorganic layers alternately stacked.

The thin film transistor TFT may be disposed on the second buffer layer BF2, and may form a pixel circuit of each of pixels. For example, the thin film transistor TFT may be a switching transistor or a driving transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. In a part of the semiconductor layer ACT, a material of the semiconductor layer ACT may be made into a conductor to form the source electrode SE and the drain electrode DE.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. For example, the gate insulating layer GI may cover the semiconductor layer ACT and the second buffer layer BF to insulate the gate electrode GE from the semiconductor layer ACT. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT to the second connection electrode CNE2. The first connection electrode CNE1 may be inserted into a contact hole provided in the second interlayer insulating layer ILD2, the first interlayer insulating layer ILD1, and the gate insulating layer GI to be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 to a pixel electrode AE of the light emitting element ED. The second connection electrode CNE2 may be inserted into a contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may include a contact hole through which the pixel electrode AE of the light emitting element ED passes. For example, the second passivation layer PAS2 may be referred to as a via insulating layer.

The light emitting element layer EML may be disposed on the thin film transistor layer TFTL. The light emitting element layer EML may include the light emitting element ED and a pixel defining layer PDL. The light emitting element ED may include the pixel electrode AE, a light emitting layer EL, and a common electrode CE.

The pixel electrode AE may be disposed on the second passivation layer PAS2. The pixel electrode AE may overlap any one of openings of the pixel defining layer PDL. The pixel electrode AE may be electrically connected to the drain electrode DE of the thin film transistor TFT through the first and second connection electrodes CNE1 and CNE2.

The pixel defining layer PDL may include openings and may be disposed on a part of the pixel electrode AE and the second passivation layer PAS2. Each opening of the pixel defining layer PDL may expose a part of the pixel electrode AE. As described above, the respective openings of the pixel defining layer PDL may define the first to third emission areas EA1, EA2, and EA3, and the areas (or sizes) thereof may be different from each other.

The pixel defining layer PDL may include an inclined portion PDLa, which forms the openings and has a shape inclined toward the outer part of each of the emission areas EA1, EA2, and EA3, and a flat portion PDLb that is disposed at a side of the inclined portion PDLa and have a flat shape. For example, the inclined portion PDLa of the pixel defining layer PDL may be disposed at the outer part of the pixel defining layer PDL, and the flat portion PDLb may be disposed at the center portion of the pixel defining layer PDL. The inclination of the inclined portion PDLa of the pixel defining layer PDL may be formed to correspond to a viewing angle of light emitted from the light emitting layer EL which will be described below. A description thereof will be given below.

The pixel defining layer PDL may separate and insulate the pixel electrode AE of each of the light emitting elements ED. The pixel defining layer PDL may include a light absorbing material to prevent light reflection. For example, the pixel defining layer PDL may include a polyimide (PI)-based binder and a pigment in which red, green, and blue colors are mixed. In another example, the pixel defining layer PDL may include a cardo-based binder resin and a mixture of a lactam black pigment and a blue pigment. In another example, the pixel defining layer PDL may include carbon black.

The light emitting layer EL may be disposed on the pixel electrode AE and a part of the pixel defining layer PDL. For example, the light emitting layer EL may be disposed on a surface of the pixel electrode AE exposed by the opening formed by the pixel defining layer PDL and a part of the inclined portion PDLa of the pixel defining layer PDL.

The light emitting layer EL may be an organic light emitting layer made of an organic material. In the case of implementing the organic light emitting layer as the light emitting layer EL, the thin film transistor TFT applies a predetermined voltage to the pixel electrode AE of the light emitting element ED, and in case that the common electrode CE of the light emitting element ED receives a common voltage or a cathode voltage, the holes and electrons may move to the light emitting layer EL through the hole transport layer and the electron transport layer and may combine to produce light to be emitted by the light emitting layer EL.

The common electrode CE may be disposed on the light emitting layer EL in the first to third emission areas EA1, EA2, and EA3, and may be disposed on the pixel defining layer PDL in an area other than the first to third emission areas EA1, EA2, and EA3. For example, the common electrode CE may be disposed on the light emitting layer EL and a part of the pixel defining layer PDL on which the light emitting layer EL is not disposed. For example, the common electrode CE may be implemented over the entire display area DA in the form of an electrode common to all pixels without being divided for the pixels.

The common electrode CE may receive the common voltage or a low potential voltage. In case that the pixel electrode AE receives a voltage corresponding to a data voltage and the common electrode CE receives the low potential voltage, a potential difference is formed between the pixel electrode AE and the common electrode CE, so that the light emitting layer EL may emit light.

Referring to FIG. 9, light emitted from the light emitting layer EL may be emitted at various angles, and its luminance may vary according to a viewing angle θ. In the present disclosure, the viewing angle θ refers to an angle between a straight line parallel to the third direction DR3 and light emitted from the light emitting layer EL. FIG. 8 illustrates the viewing angle θ as an angle formed by a path LD of light emitted from the light emitting layer EL and a straight line parallel to the third direction DR3.

For example, the luminance of light emitted from the light emitting layer EL may have a correlation with the viewing angle θ, in which it decreases as the viewing angle θ increases, as shown in FIG. 9. For example, in case that light emitted from the light emitting layer EL is red and the viewing angle θ is 30°, the luminance thereof may be 80% of the luminance in the case where the viewing angle θ is 0°. In case that the luminance of light emitted from the light emitting layer EL is 80% or more of the luminance in the case where the viewing angle θ is 0°, the user may sufficiently recognize light emitted to the outside from the display device 10. Accordingly, in case that the inclined portion PDLa of the pixel defining layer PDL is formed to be inclined such that the path LD of light, which is emitted from the end portion of the light emitting layer EL without being blocked by the pixel defining layer PDL, forms an angle of about 30° with a straight line parallel to the third direction DR3, light efficiency may be increased due to light obliquely emitted from the light emitting layer EL, and the image may be viewed not only from the front surface of the display device 10 but also from the side surface thereof. In some embodiments, the path LD of light may form an angle of about 30° with a straight line parallel to the third direction DR3, but embodiments are not limited thereto.

Referring back to FIGS. 7 and 8, the encapsulation layer TFEL may be disposed on the common electrode CE to cover the light emitting elements ED. In some embodiments, the encapsulation layer TFEL may include at least one inorganic layer and at least one organic layer, thereby preventing foreign substances such as oxygen, moisture, or dust from penetrating (or permeating) into the light emitting element layer EML.

In an embodiment, the encapsulation layer TFEL may include a first encapsulation layer TFE1, a second encapsulation layer TFE2, and a third encapsulation layer TFE3 that are sequentially stacked in the third direction DR3. The first encapsulation layer TFE1 and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include acrylic resin, epoxy resin, polyimide, polyethylene and the like. For example, the organic encapsulation layer 320 may include an acrylic resin, for example, polymethyl methacrylate, polyacrylic acid, or the like. The second encapsulation layer TFE2 may be formed by curing a monomer or applying a polymer.

The second encapsulation layer TFE2 may be disposed to correspond to (or overlap) each of the emission areas EA1, EA2, and EA3, and may not be disposed in other areas.

For example, the first encapsulation layer TFE1 may be disposed on the common electrode CE, and formed to have a flat profile (or flat shape) at a portion overlapping the emission areas EA1, EA2, and EA3 and have an inclined profile (or inclined shape) at a portion overlapping the inclined portion PDLa of the pixel defining layer PDL, thereby forming a space in which the second encapsulation layer TFE2 are disposed in each of the emission areas EA1, EA2, and EA3. The second encapsulation layer TFE2 may be disposed in the space formed by the first encapsulation layer TFE1 in each of the emission areas EA1, EA2, and EA3, and thus may be formed on the inclined portion PDLa of the pixel defining layer PDL, but the second encapsulation layer TFE2 may not be disposed on the flat portion PDLb. For example, the second encapsulation layers TFE2 may be disposed in the respective emission areas EA1, EA2, and EA3, and may be spaced apart from each other by the pixel defining layer PDL interposed therebetween. The third encapsulation layer TFE3 may be in contact with (e.g., in direct contact with) the second encapsulation layer TFE2 in a portion where the second encapsulation layer TFE2 is disposed, and may be in contact with (e.g., in direct contact with) the first encapsulation layer TFE1 in a portion where the second encapsulation layer TFE2 is not disposed.

With the above-described configuration, the encapsulation layer TFEL may cover (e.g., completely cover) organic particles PC formed during the manufacturing process of the display device 10, which will be described below.

The first light blocking layer BM1 may be disposed on the encapsulation layer TFEL to form openings that respectively overlap the emission areas EA1, EA2, and EA3. For example, a first opening of the first light blocking layer BM1 may overlap the first emission area EA1. A second opening of the first light blocking layer BM1 may overlap the second emission area EA2. A third opening of the second light blocking layer BM2 may overlap the third emission area EA3.

The first light blocking layer BM1 may include a light absorbing material. In some embodiments, the first light blocking layer BM1 may include an inorganic black pigment or an organic black pigment. The inorganic black pigment may be carbon black, and the organic black pigment may include at least one of lactam black, perylene black, or aniline black, but embodiments are not limited thereto.

The first light blocking layer BM1 may absorb external light incident from the outside to prevent reflection of the external light, and prevent visible light infiltration and color mixture between the first to third emission areas EA1, EA2, and EA3, thereby improving color reproducibility of the display device 10. For example, as the area of the first light blocking layer BM1 increases, the ratio of external light reflection may be decreased and the color reproducibility of the electronic device 1 may be improved.

The area (or size) of each opening of the first light blocking layer BM1 may be greater than the area (or size) of each opening of the pixel defining layer PDL. For example, a width w1 of the opening formed by the first light blocking layer BM1 may be greater than a width w0 of the opening formed by the pixel defining layer PDL.

However, as described above, in case that the path LD of light, which is emitted from the end portion of the light emitting layer EL without being blocked by the pixel defining layer PDL, forms an angle of about 30° with a straight line parallel to the third direction DR3, the light efficiency may be increased and the image may be viewed from the side as well as the front. Therefore, light efficiency and side visibility may be ensured in case that the area of the first light blocking layer BM1 is expanded not to exceed the path LD of light.

For example, since the path LD of light further spreads to the outside of each of the emission areas EA1, EA2, and EA3 as going toward a side in the third direction DR3, the area occupied by the first light blocking layer BM1 may decrease as the position of the first light blocking layer BM1 is farther from the light emitting element ED in the third direction DR3. Therefore, in order to maximize the area of the first light blocking layer BM1 within a limit that does not affect the light efficiency and side visibility of the display device 10, the first light blocking layer BM1 may be disposed as close to the light emitting element ED as possible in the third direction DR3.

The first light blocking layer BM1 of the display device 10 according to an embodiment may be disposed substantially on a portion where the first encapsulation layer TFEL1 and the third encapsulation layer TFEL3 of the encapsulation layer TFEL are in contact with (e.g., in direct contact with) each other. The first light blocking layer BM1 may be in contact with (e.g., in direct contact with) the third encapsulation layer TFEL3. As described above, the second encapsulation layers TFE2 may be disposed mostly in the emission areas EA1, EA2, and EA3, and may not be disposed in other areas, so that the thickness of the encapsulation layer TFEL itself may be decreased. Accordingly, the area of the first light blocking layer BM1 disposed thereon may be maximized within a limit that does not affect the light efficiency and side visibility of the display device 10, thereby improving the external light reflectance.

A first overcoat layer OC1 may be disposed on the first light blocking layer BM1 and the third encapsulation layer TFE3 of the encapsulation layer TFEL on which the first light blocking layer BM1 is not disposed. The first overcoat layer OC1 may function as a planarization layer that compensates for a step generated by the first light blocking layer BM1. For example, the first overcoat layer OC1 may have a relatively lower dielectric constant than that of the second encapsulation layer TFE2, thereby increasing sensitivity of the touch sensing layer TSU which will be described below. For example, the dielectric constant of the first overcoat layer OC1 may be about 2 F/m, but embodiments are not limited thereto.

The touch sensing layer TSU may be disposed on the first overcoat layer OC1. The touch sensing layer TSU may include a first touch insulating layer SILL a second touch insulating layer SIL2, a touch electrode SEN, and a third touch insulating layer SIL3.

The first touch insulating layer SIL1 may be disposed on the first overcoat layer OC1. The first touch insulating layer SIL1 may have an insulating and optical function. The first touch insulating layer SIL1 may include at least one inorganic layer. In another example, the first touch insulating layer SIL1 may be omitted.

The second touch insulating layer SIL2 may cover the first touch insulating layer SILL For example, the bridge electrode BE described above with reference to FIG. 6 may be further disposed on the first touch insulating layer SILL as a touch electrode of another layer. The second touch insulating layer SIL2 may cover the bridge electrode BE. The second touch insulating layer SIL2 may have an insulating and optical function. For example, the second touch insulating layer SIL2 may be an inorganic layer including at least one of a silicon nitride layer, a silicon oxynitride layer, a silicon oxide layer, a titanium oxide layer, or an aluminum oxide layer.

Among the touch electrodes SEN, the driving electrode TE and the sensing electrode RE may be disposed on the second touch insulating layer SIL2. FIG. 8 illustrates a first portion REa and a second portion REb of the sensing electrode RE. Each of the driving electrode TE and the sensing electrode RE may not overlap the first to third emission areas EA1, EA2, and EA3. Each of the driving electrode TE and the sensing electrode RE may be formed of a single layer including molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The third touch insulating layer SIL3 may cover the driving electrode TE, the sensing electrode RE, and the second touch insulating layer SIL2. The third touch insulating layer SIL3 may have an insulating and optical function. The third touch insulating layer SIL3 may be made of the materials such as the second touch insulating layer SIL2, but embodiments are not limited thereto.

The second light blocking layer BM2 may be disposed on the third touch insulating layer SIL3 of the touch sensing layer TSU. The second light blocking layer BM2 may cover the touch electrode SEN, and may include openings disposed to overlap the emission areas EA1, EA2, and EA3. For example, a first opening of the second light blocking layer BM2 may overlap the first emission area EA1 or the first opening of the first light blocking layer BM1. A second opening of the second light blocking layer BM2 may overlap the second emission area EA2 or the second opening of the first light blocking layer BM1. A third opening of the second light blocking layer BM2 may overlap the third emission area EA3 or the third opening of the first light blocking layer BM1.

The second light blocking layer BM2 may include a light absorbing material. For example, the second light blocking layer BM2 may include an inorganic black pigment or an organic black pigment. The inorganic black pigment may be carbon black, and the organic black pigment may include at least one of lactam black, perylene black, or aniline black, but embodiments are not limited thereto. The second light blocking layer BM2 may prevent visible light infiltration and color mixture between the first to third emission areas EA1, EA2, and EA3 such that, color reproducibility of the display device 10 may be improved.

The area (or size) of each opening of the second light blocking layer BM2 may be greater than the area (or size) of each opening of the pixel defining layer PDL, and may be greater than the area (or size) of each opening of the first light blocking layer BM1. For example, a width w2 of the opening formed by the second light blocking layer BM2 may be greater than the width w1 of the opening formed by the first light blocking layer BM1 and the width w0 of the opening formed by the pixel defining layer PDL. Accordingly, lights emitted from the emission areas EA1, EA2, and EA3 may be recognized by the user not only from the front surface of the display device 10 but also from the side surface thereof. In the case of the first light blocking layer BM1, the second light blocking layer BM2 may be also disposed not to exceed the path LD of light emitted from the end portion of the light emitting layer EL without being blocked by the pixel defining layer PDL.

Color filters CF1, CF2, and CF3 of the color filter layer CFL may be disposed on the second light blocking layer BM2 and the third touch insulating layer SIL3. The different color filters CF1, CF2, and CF3 may be disposed to correspond respectively to (or overlap) the different emission areas EA1, EA2, EA3 or the openings formed by the first and second light blocking layers BM1 and BM2.

For example, the first color filter CF1 may be disposed to correspond to (or overlap) the first emission area EA1, the second color filter CF2 may be disposed to correspond to (or overlap) the second emission area EA2, and the third color filter CF3 may be disposed to correspond to (or overlap) the third emission area EA3. The first color filter CF1 may be disposed in the first hole OPT1 of the second light blocking layer BM2, the second color filter CF2 may be disposed in the second hole OPT2 of the second light blocking layer BM2, and the third color filter CF3 may be disposed in the third hole OPT3 of the second light blocking layer BM2. Each of the color filters CF1, CF2, and CF3 may have a larger area than that of the openings of the second light blocking layer BM2 in plan view, and some of them may be disposed directly on the second light blocking layer BM2.

A second overcoat layer OC2 may be disposed on the color filters CF1, CF2, and CF3 to planarize the top end portions of the color filters CF1, CF2, and CF3. The second overcoat layer OC2 may be a colorless light transmissive layer that does not have a color in a visible light band. For example, the second overcoat layer OC2 may include a colorless light transmissive organic material such as an acrylic resin.

The display device 10 according to an embodiment may further include the organic particles PC. The organic particles PC may be residues generated with forming the light emitting layer EL in the manufacturing process of a display device which will be described below, and may be generally disposed on the flat portion PDLb of the pixel defining layer PDL, but embodiments are limited thereto. FIG. 8 illustrates that the organic particles PC are disposed on the flat portion PDLb of the pixel defining layer PDL.

The organic particles PC may penetrate the common electrode CE and the first encapsulation layer TFE1 of the encapsulation layer TFEL, but may be disposed in a partial area as shown in FIG. 7 so that contacts between the common electrode CE and the different emission areas EA1, EA2, and EA3 may be ensured in portions where the organic particles PC are not disposed. The organic particles PC may be covered (e.g., completely covered) by the third encapsulation layer TFE3 of the encapsulation layer TFEL.

Hereinafter, a formation process of the organic particles PC and a manufacturing process of a display device according to an embodiment will be described.

FIGS. 10 to 17 are cross-sectional views showing the steps of a process of manufacturing a display device according to an embodiment.

Figure 10:
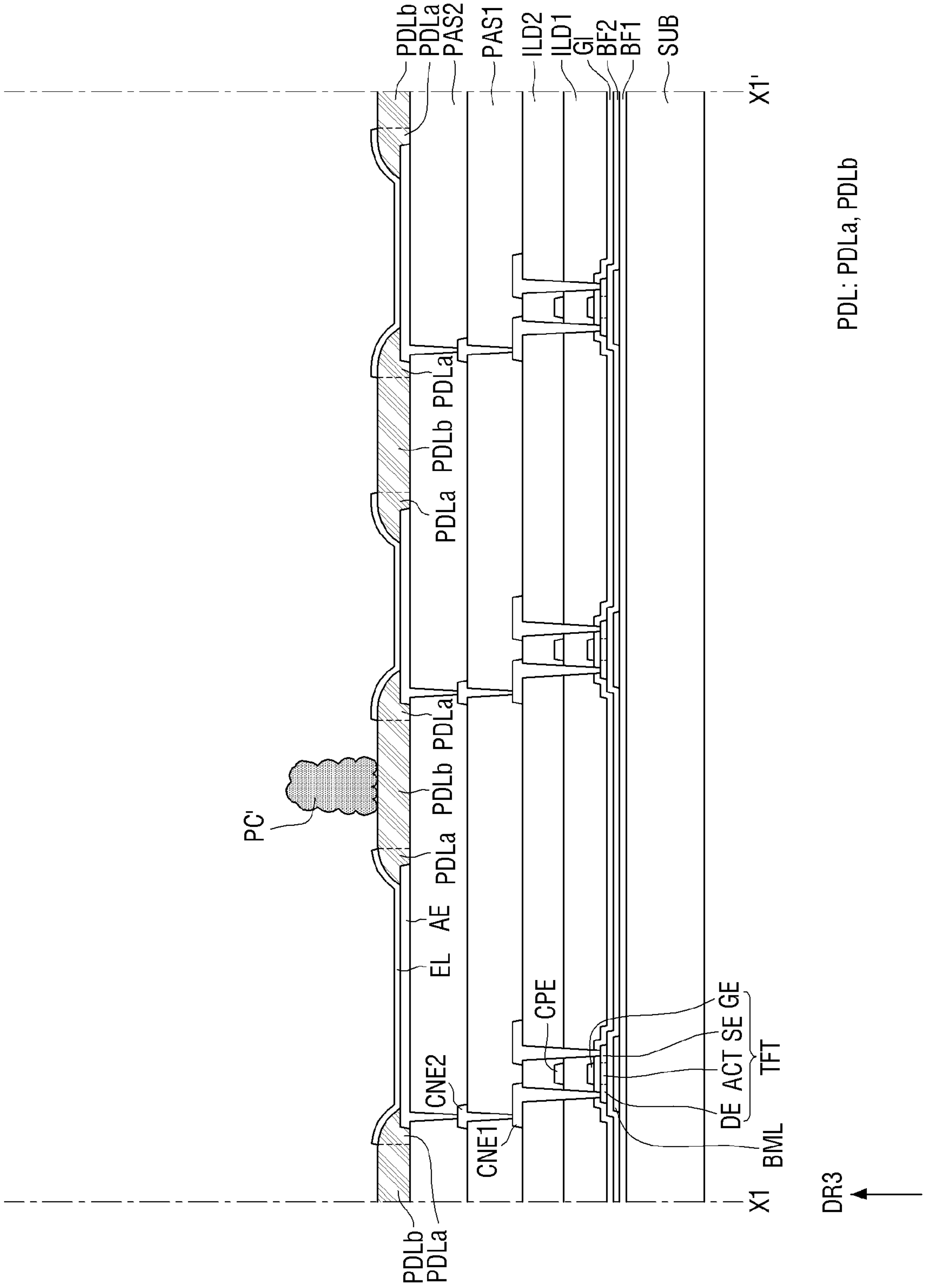
FIGS. 10 to 17 are cross-sectional views showing the steps of a process of manufacturing a display device according to an embodiment.

Referring to FIG. 10, the light emitting layer EL may be formed on the pixel electrode AE exposed by the pixel defining layer PDL. The process of forming the light emitting layer EL may be performed, for example, by a chemical vapor deposition (CVD) method, but embodiments are not limited thereto.

As shown in FIG. 10, an organic residue PC' may be formed during the process of forming the light emitting layer EL. The organic residue PC' may be a residue generated with forming the light emitting layer EL, and may include substantially the same material as the light emitting layer EL.

In case that a process of forming a thin film encapsulation layer is performed as a subsequent process in the presence of the organic residue PC', there is a possibility that external moisture may permeate through the organic residue PC'. Accordingly, the organic residue PC' needs to be removed or decreased in size. The organic particles PC shown in FIG. 8 may be the organic residue PC' decreased in size through a subsequent process. A description thereof will be given below.

Figure 11:
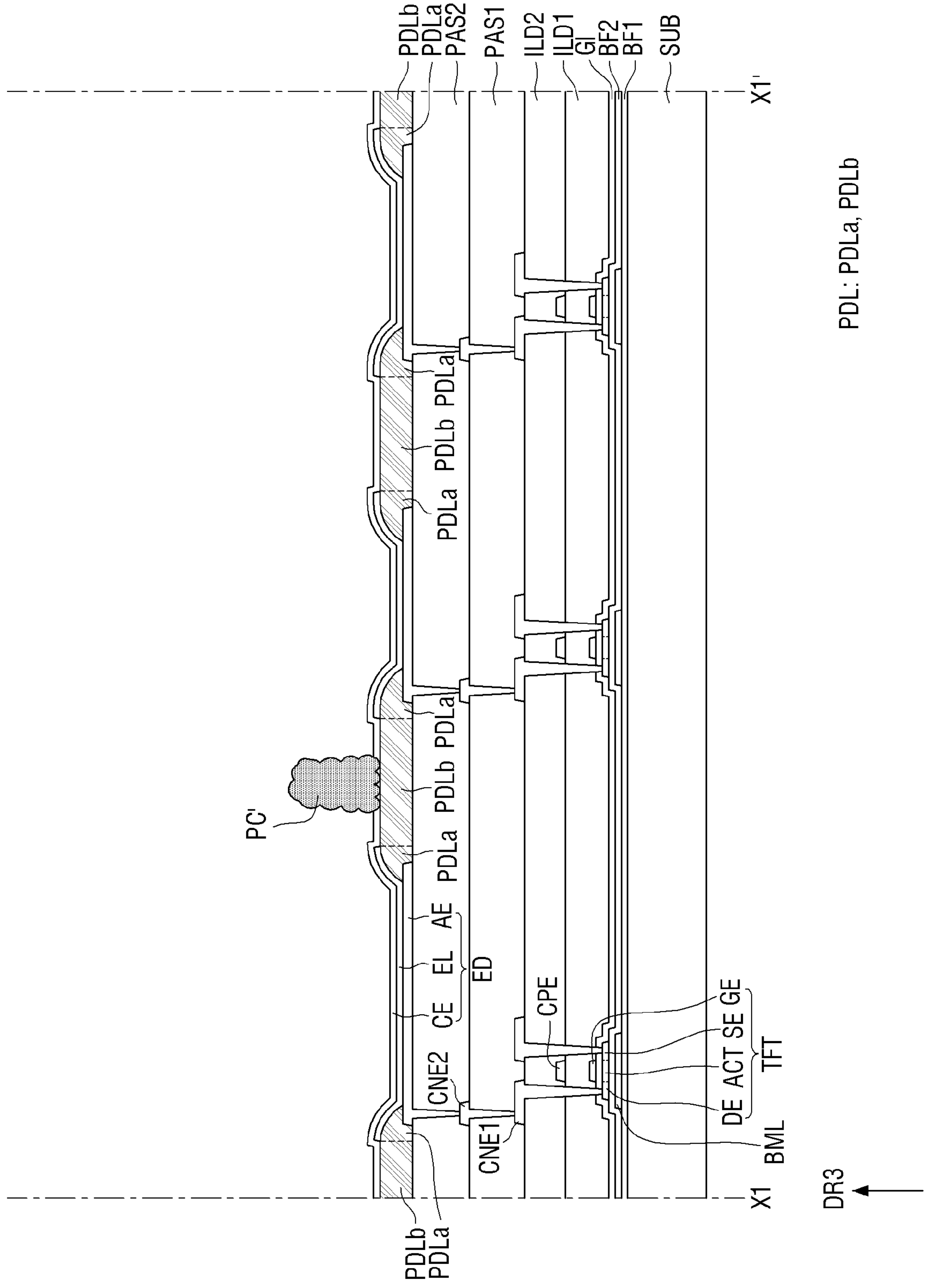

Referring to FIG. 11, the common electrode CE may be formed on the light emitting layer EL. The process of forming the common electrode CE may be performed, for example, by the chemical vapor deposition (CVD) method, but embodiments are not limited thereto.

The common electrode CE may be formed over the entire surface of the display area DA as described above, but may not cover the organic residue PC'. For example, the organic residue PC' may penetrate the common electrode CE. In some embodiments, a part of the common electrode CE may be disposed on the top surface of the organic residue PC'.

Figure 12:
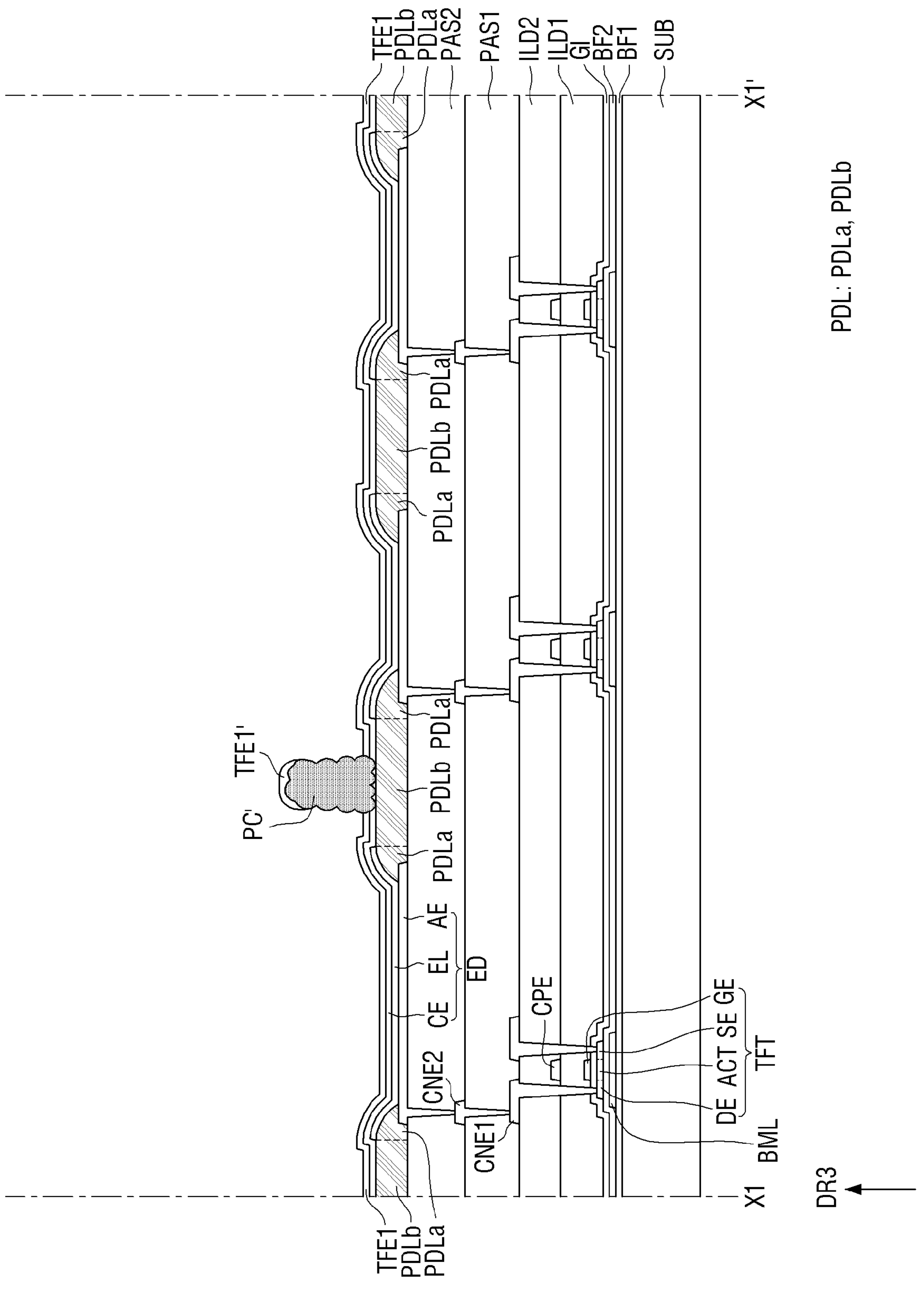

Referring to FIG. 12, the first encapsulation layer TFE1 may be formed on the common electrode CE. The first encapsulation layer TFE1 may not completely cover the organic residue PC', and may be broken at a portion where the organic residue PC' is disposed. For example, the organic residue PC' may penetrate the first encapsulation layer TFE1, and a portion TFE1' of the first encapsulation layer TFE1 may be disposed on the top surface of the organic residue PC'.

Figure 13:
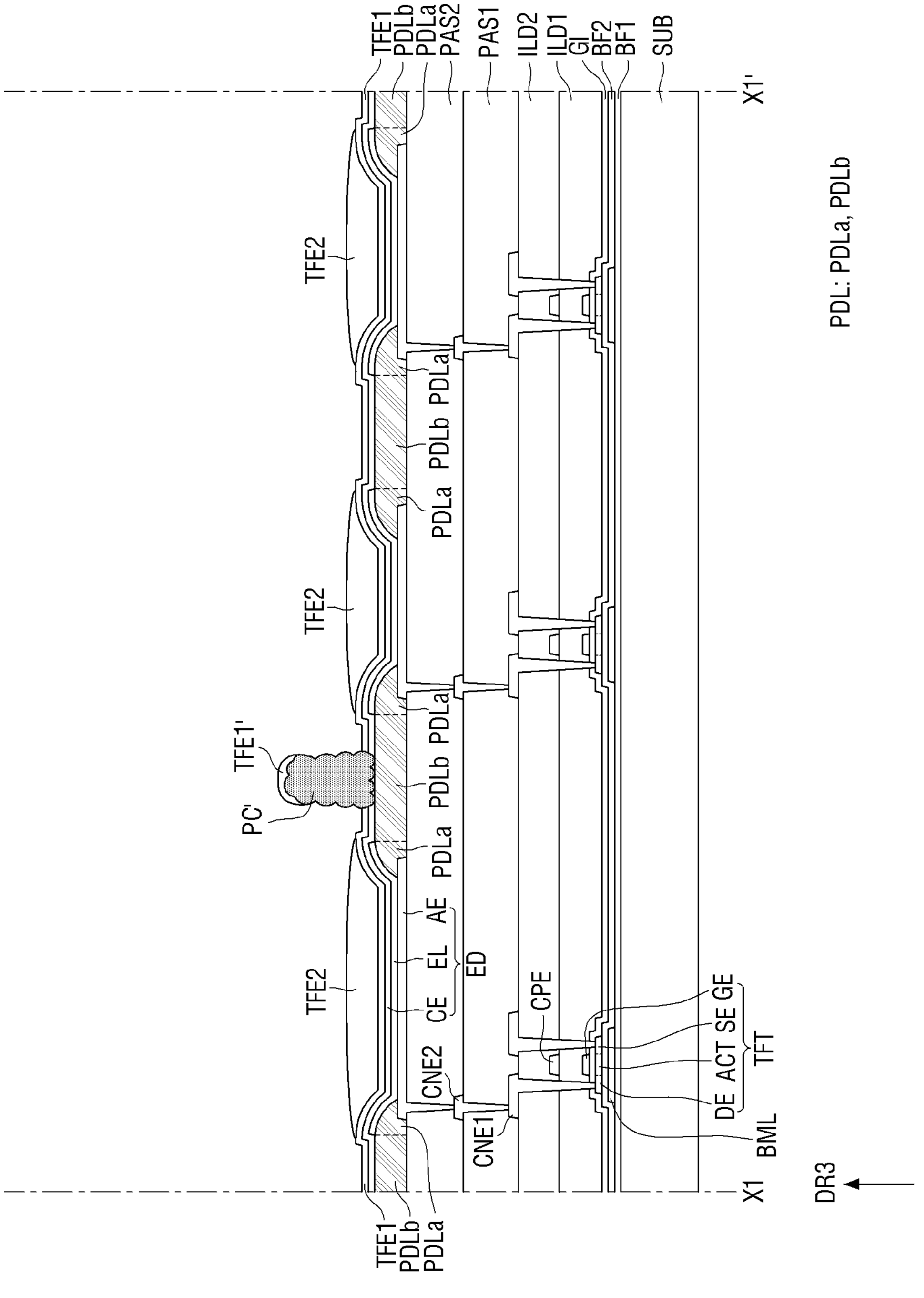

Referring to FIG. 13, the second encapsulation layer TFE2 may be formed in each opening formed in the pixel defining layer PDL. The process of forming the second encapsulation layer TFE2 may be performed by using, for example, an inkjet printing device.

Since the second encapsulation layer TFE2 is selectively disposed in the opening formed in the pixel defining layer PDL, the thickness of the encapsulation layer TFEL itself may be decreased as described above, and the area of the first light blocking layer BM1 disposed thereon may be enlarged to the maximum.

Figure 14:
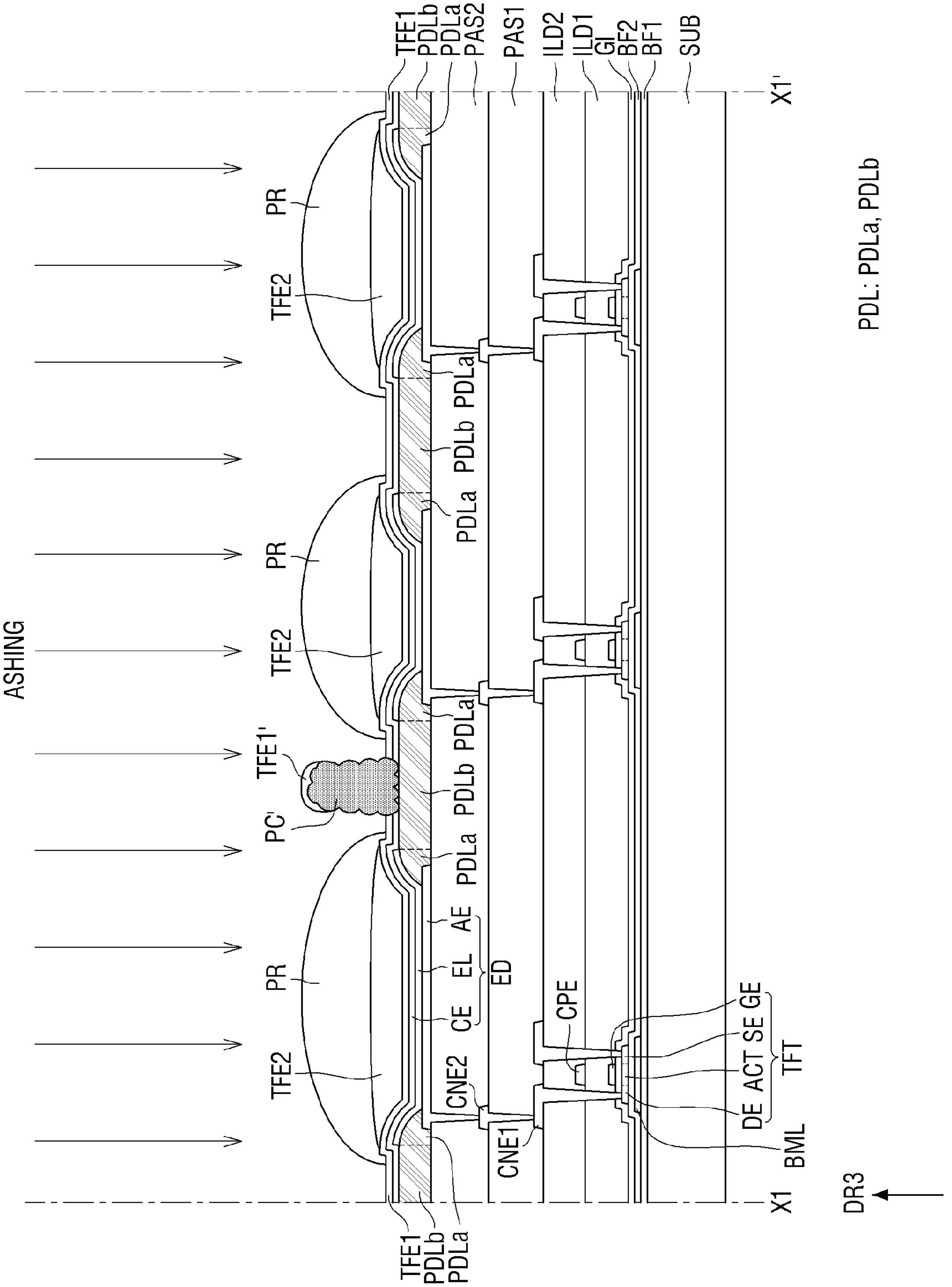
Figure 15:
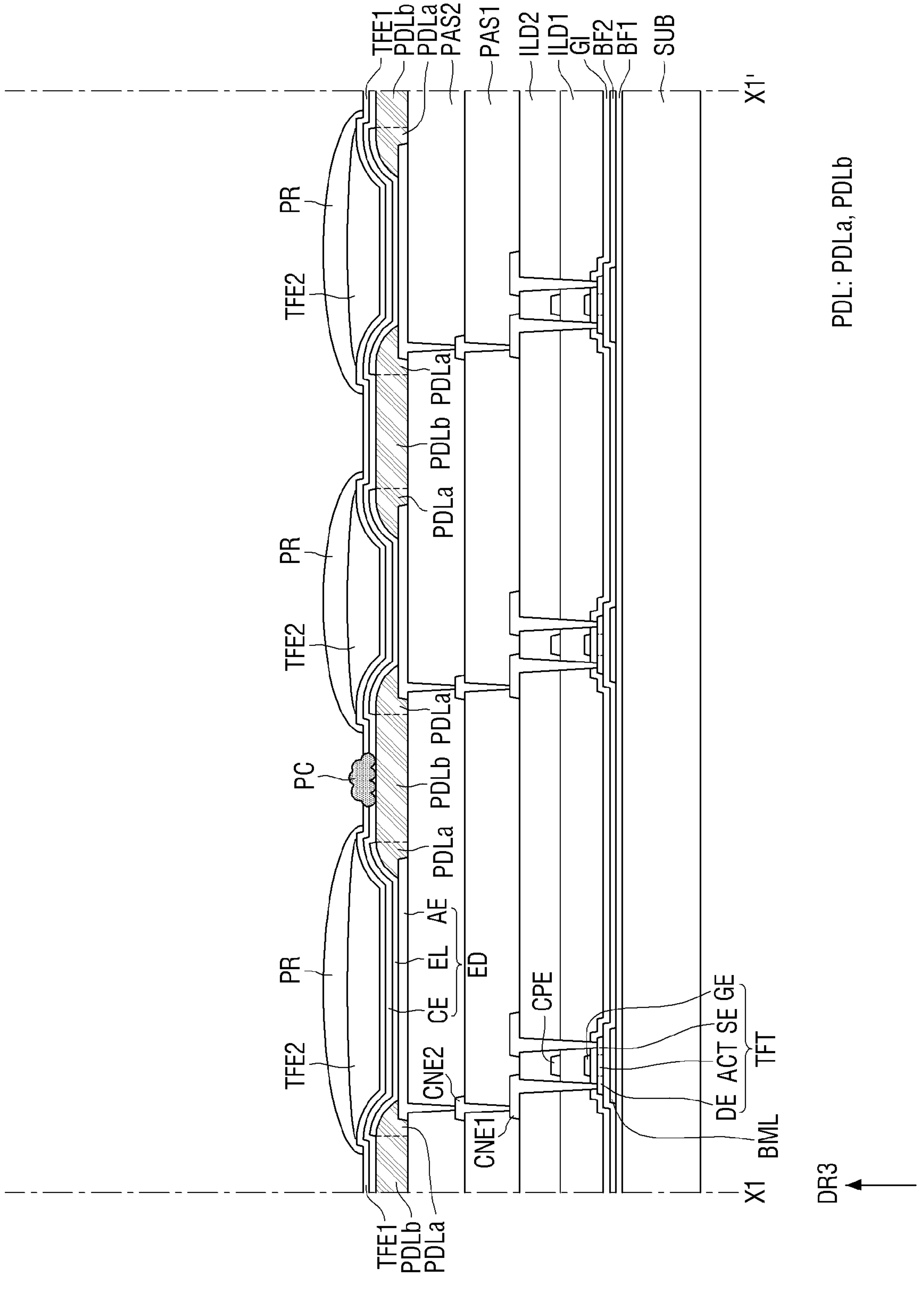

Referring to FIGS. 14 and 15, a photoresist pattern PR may be formed on the second encapsulation layer TFE2 and the organic residue PC' is removed. The process of forming the photoresist pattern PR on the second encapsulation layer TFE2 may be performed, for example, by forming a photosensitive organic material and by developing and exposing the photosensitive organic material.

The process of removing the organic residue PC' may be performed, for example, by a dry etching process. For example, the process of removing the organic residue PC' may be performed by using an etching gas that is not reactive to the first encapsulation layer TFE1. Accordingly, the first encapsulation layer TFE1 may not be etched. For example, the photoresist pattern PR disposed on the second encapsulation layer TFE2 may function as an etch stop layer to protect the second encapsulation layer TFE2 from the etching gas. As the side surface of the organic residue PC' is also etched, the portion TFE1' of the first encapsulation layer TFE1 disposed on the organic residue PC' may be removed together with the organic residue PC'.

Accordingly, the organic residue PC' may be completely removed or a part thereof is removed, and thus it is decreased in size to become the organic particle PC. Since the photoresist pattern PR disposed on the second encapsulation layer TFE2 is also slightly etched, its thickness may be decreased.

Figure 16:
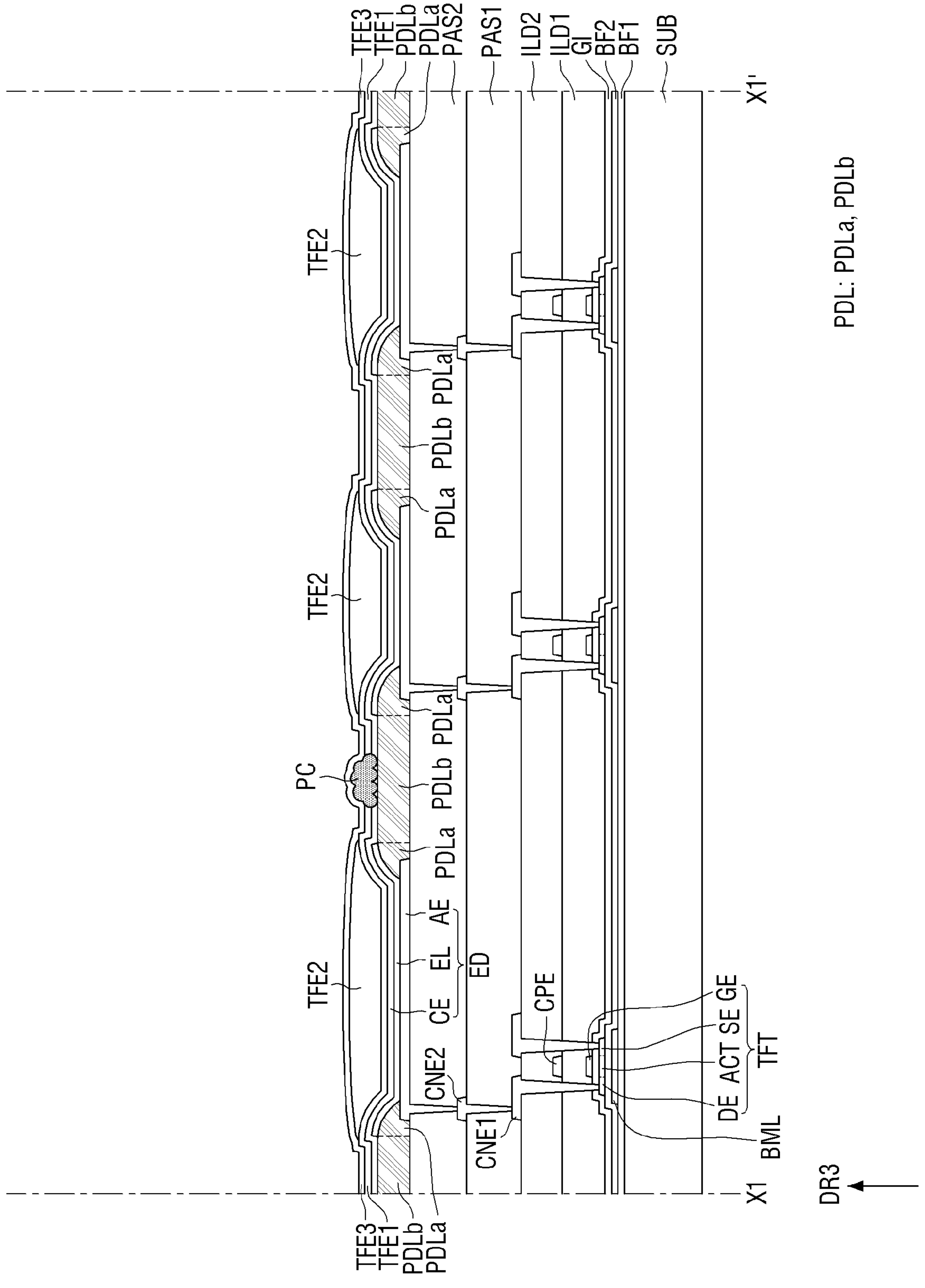
Figure 17:
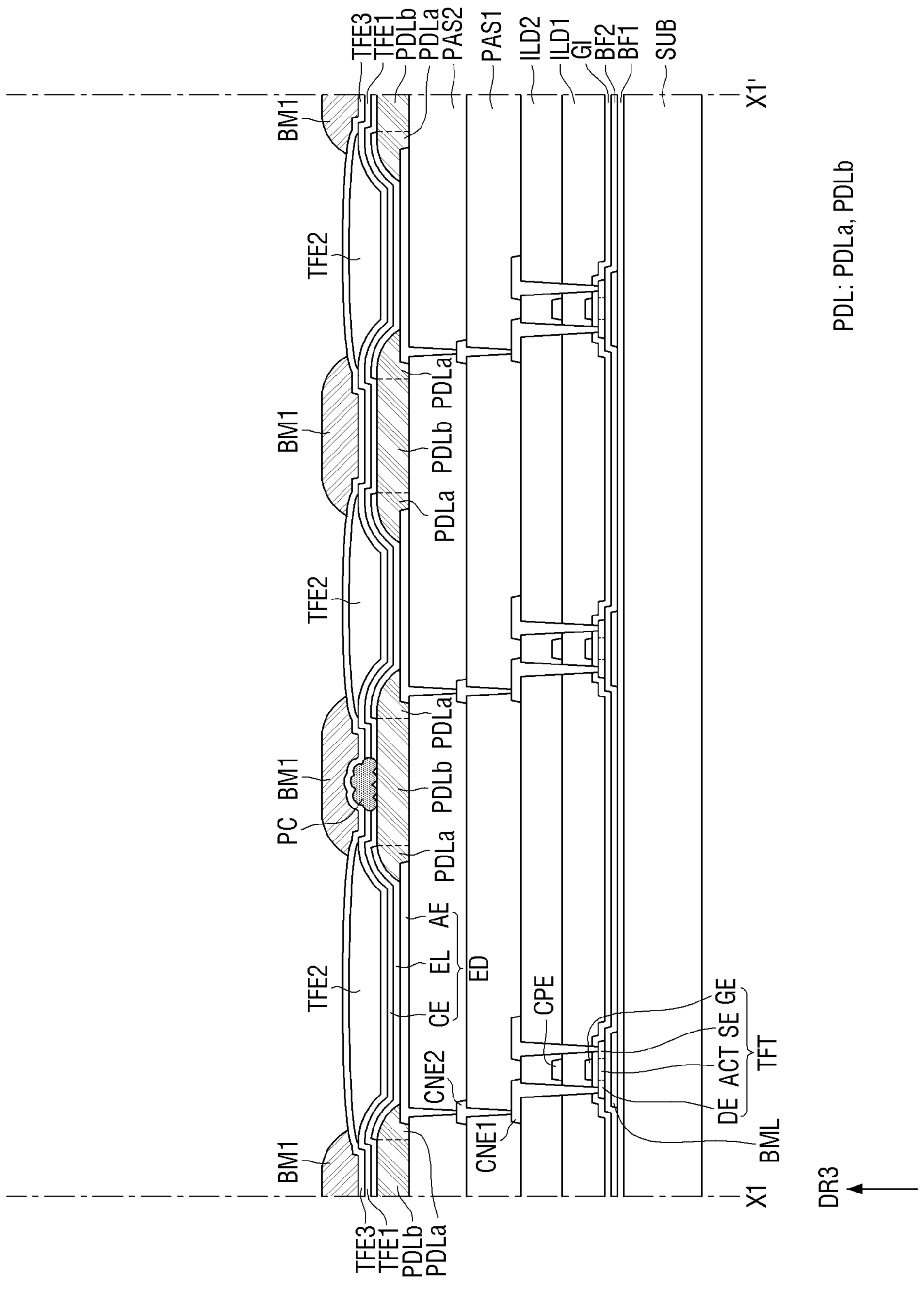

Referring to FIGS. 16 and 17, the third encapsulation layer TFE3 may be formed on the second encapsulation layer TFE2 and the organic particle PC, and the first light blocking layer BM1 may be formed on the third encapsulation layer TFE3.

Accordingly, the organic particle PC may be isolated from the outside by the third encapsulation layer TFE3. For example, since the organic particle PC is surrounded by the third encapsulation layer TFE3, and the first encapsulation layer and the third encapsulation layer TFE3 are in contact with (e.g., in direct contact with) each other in the periphery of the organic particle PC to form inorganic-inorganic bonding, external moisture may not permeate into the organic particle PC.

The display device 10 illustrated in FIG. 8 may be manufactured by a subsequent process performed thereafter.

Hereinafter, another embodiment of the display device 10 will be described. In the following embodiments, description of the same components as those of the above-described embodiment, which are denoted by like reference numerals, will be omitted or simplified, and differences will be described for descriptive convenience.

Figure 18:
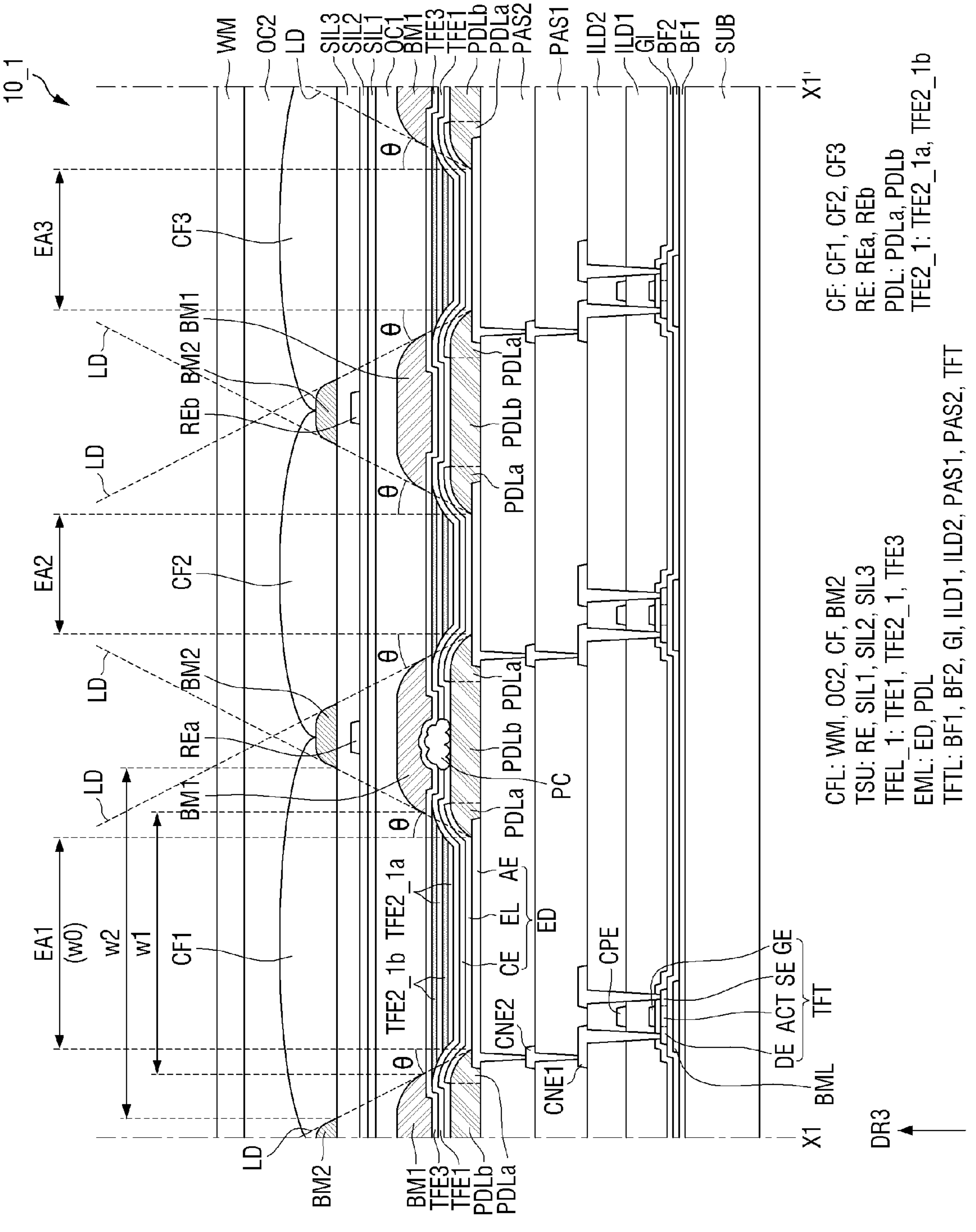
FIG. 18 is a schematic cross-sectional view illustrating a pixel structure of a display device according to another embodiment.

FIG. 18 is a schematic cross-sectional view illustrating a pixel structure of a display device according to another embodiment.

Referring to FIG. 18, it is illustrated that an encapsulation layer TFEL_1 of a display device 10_1 may include a second encapsulation layer TFE2_1 having a structure in which inorganic layers are stacked.

For example, the second encapsulation layer TFE2_1 may have a structure in which a first layer TFE2_1*a* and a second layer TFE2_1*b*, which include different materials, are alternately and repeatedly stacked. In some embodiments, each of the first layer TFE2_1*a* and the second layer TFE2_1*b* may be stacked by two layers, but embodiments are not limited thereto. FIG. 18 illustrates that each of the first layer TFE2_1*a* and the second layer TFE2_1*b* is stacked by two layers.

One of the first layer TFE2_1*a* and the second layer TFE2_1*b* may include silicon oxycarbide (SiOC) and the other may include silicon nitride (SiNx). In case that any one of them includes silicon oxycarbide (SiOC), it may readily perform a planarization function. Further, in case that any one of them includes silicon nitride (SiNx), it may readily perform a function of effectively preventing permeation of an external material.

With the above-described configuration, an external material may be effectively prevented from permeating into the light emitting layer EL.

Figure 19:
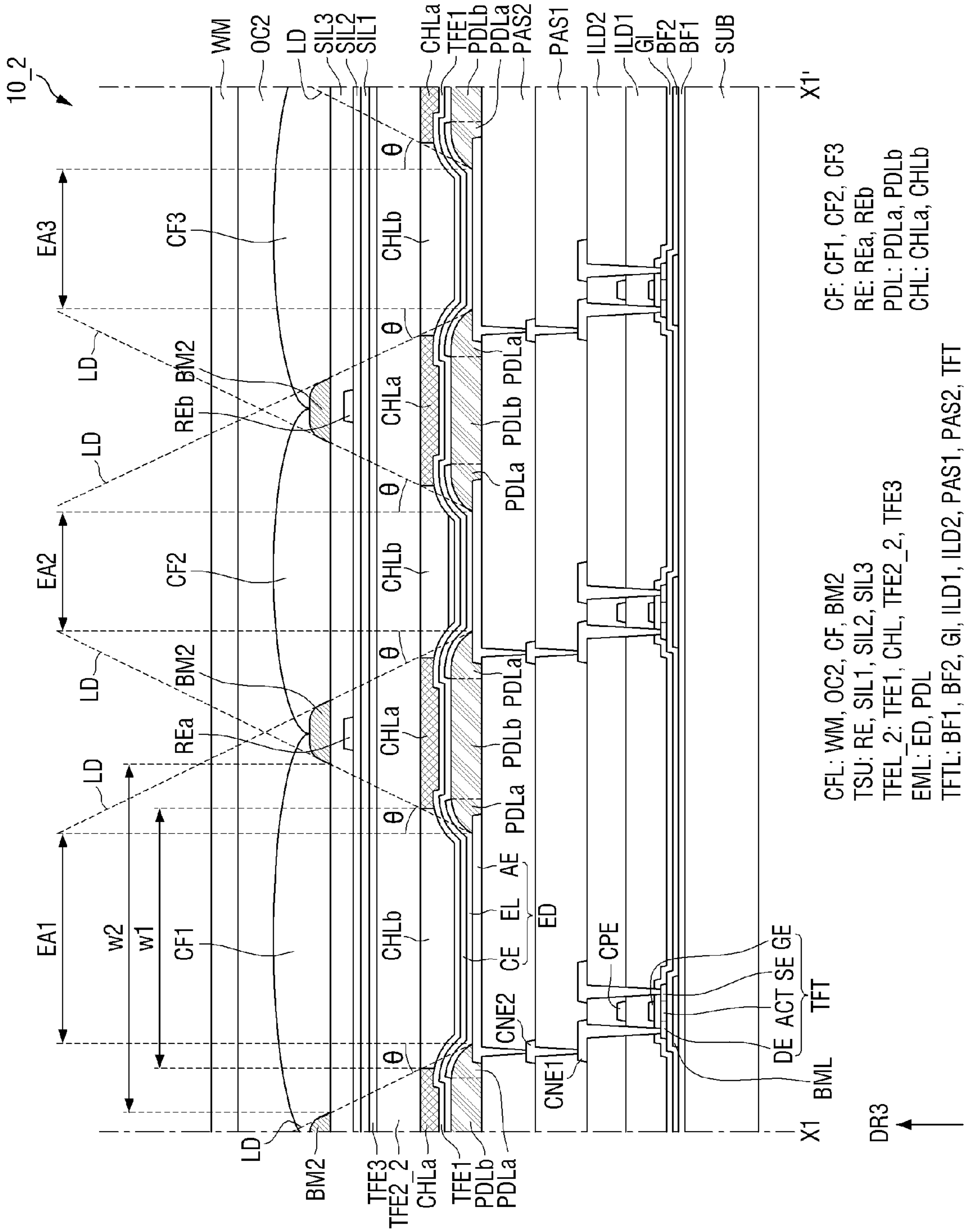
FIG. 19 is a schematic cross-sectional view illustrating a pixel structure of a display device according to still another embodiment.

FIG. 19 is a schematic cross-sectional view illustrating a pixel structure of a display device according to still another embodiment.

Referring to FIG. 19, it is illustrated that an encapsulation layer of a display device 10_2 according to an embodiment may include the first encapsulation layer TFE1, a color change layer CHL disposed on the first encapsulation layer TFE1, a second encapsulation layer TFE2_2 disposed on the color change layer CHL, and the third encapsulation layer TFE3 disposed on the second encapsulation layer TFE2_2. The second encapsulation layer TFE2_2 does not correspond to (or overlap) only one emission area, but may be formed over the entire surface of the display area DA to overlap all of the emission areas EA1, EA2, and EA3.

The color change layer CHL may be formed on the first encapsulation layer TFE1. The color change layer CHL may include a color change region CHLa, which at least overlaps the inclined portion PDLa of the pixel defining layer PDL, and a transparent region CHLb which at least overlaps the flat portion PDLb of the pixel defining layer PDL. The color change region CHLa may be a region of the color change layer CHL, which is discolored by performing a separate process on the color change layer CHL, and the transparent region CHLb may be a transparent region of the color change layer CHL on which a separate process is not performed. The color change region CHLa and the first light blocking layer BM1 may perform the same function, e.g., preventing reflection of external light or the like.

In some embodiments, the color change layer CHL may include tungsten trioxide ($WO_3$) as an electrochromic material, or ammonium metavanadate ($NH_4VO_3$) or the like as a thermochromic material, but embodiments are not limited thereto.

In some embodiments, the first overcoat layer OC1 disposed on the third encapsulation layer TFE3 may be omitted, but embodiments are not limited thereto.

With the above-described configuration, since the color change region CHLa functioning to block light is disposed directly on the first encapsulation layer TFE1, the area of the color change region CHLa functioning to block light may be further increased.

Figure 20:
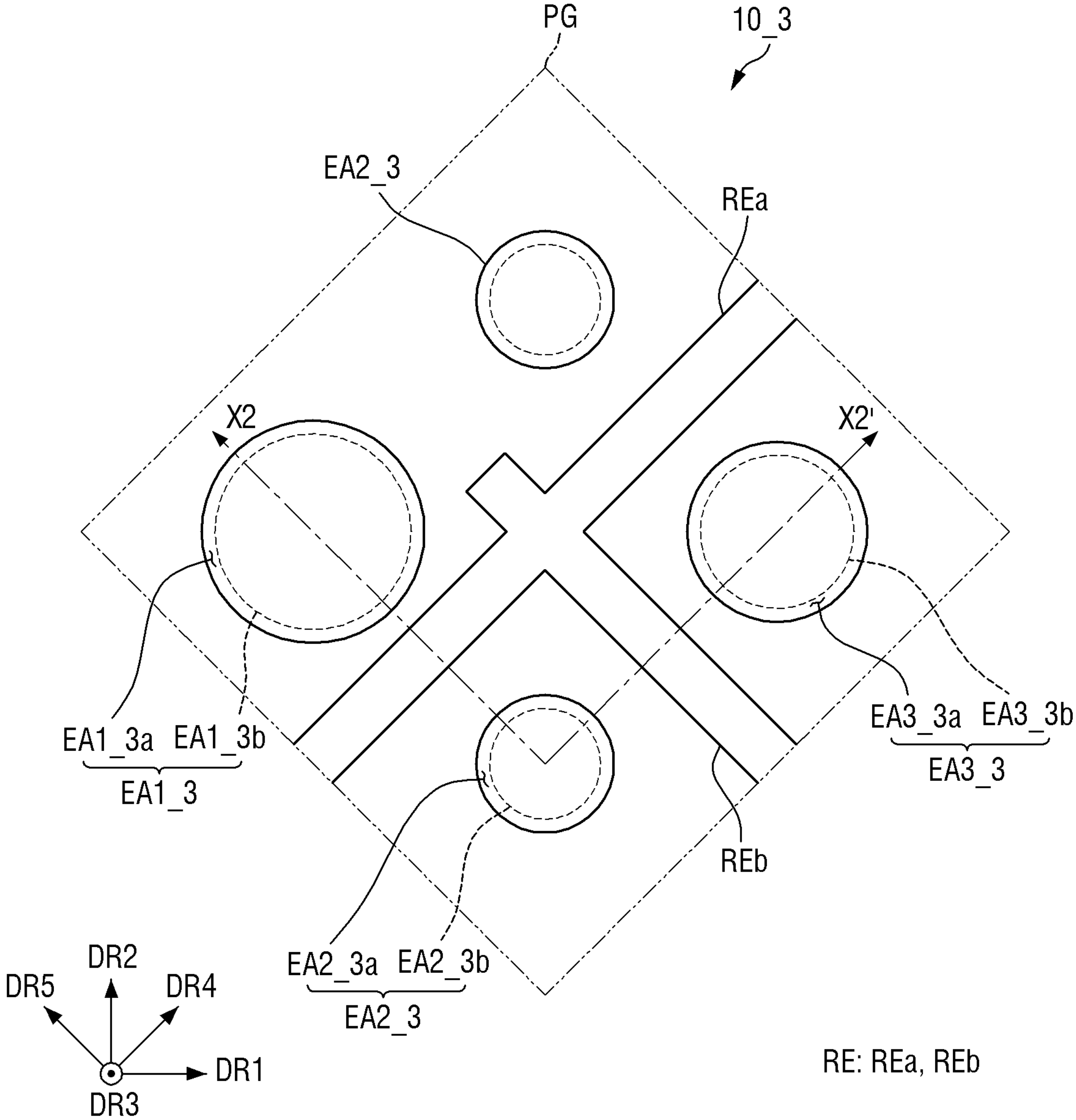
FIG. 20 is a schematic enlarged view of a pixel group of a display device according to still another embodiment.
Figure 21:
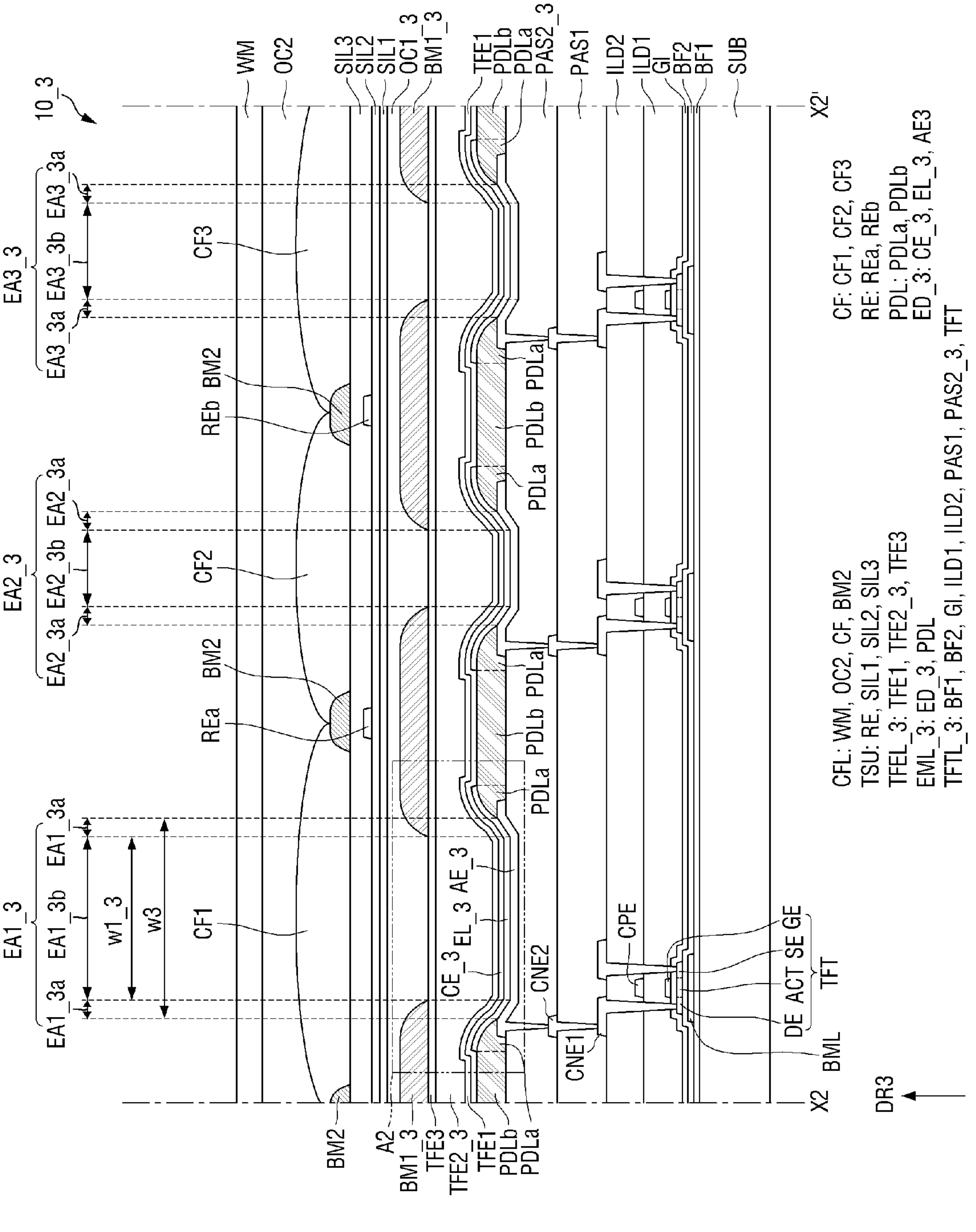
FIG. 21 is a schematic cross-sectional view illustrating a schematic cross section taken along line X2-X2' of FIG. 20.
Figure 22:
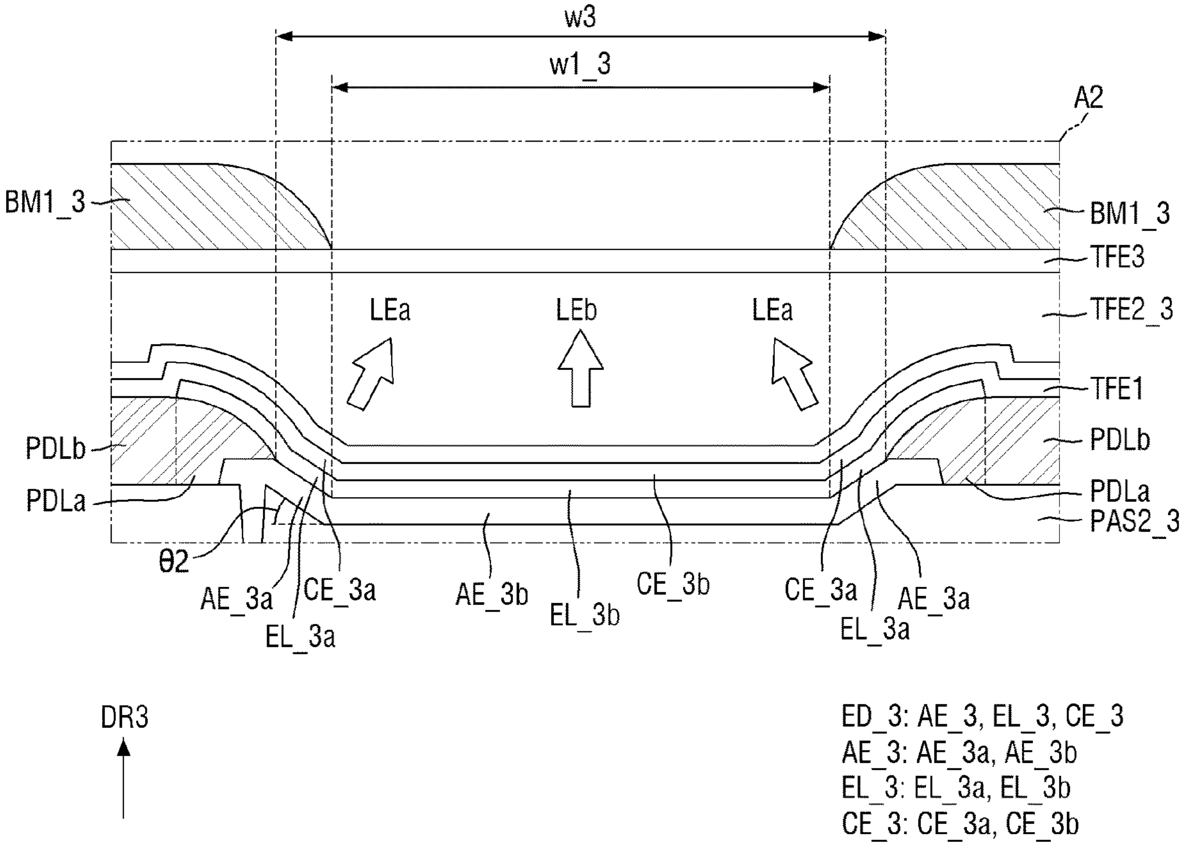
FIG. 22 is a schematic enlarged view of area A2 of FIG. 21.

FIG. 20 is a schematic enlarged view of a pixel group of a display device according to still another embodiment. FIG. 21 is a schematic cross-sectional view illustrating a schematic cross section taken along line X2-X2' of FIG. 20. FIG. 22 is a schematic enlarged view of area A2 of FIG. 21.

Referring to FIGS. 20 to 22, a display device 10_3 according to an embodiment is illustrated, in which a shape of a pixel electrode AE_3 of a light emitting element ED_3 may be bent, and a first light blocking layer BM1_3 may be expanded to overlap the bent part of the pixel electrode AE_3.

Each of the emission areas EA1_3, EA2_3, and EA3_3 of the display device 10_3 according to an embodiment may include a flat surface emission area and an inclined surface emission area that surrounds the flat surface emission area. The flat surface emission area may be an area in which the pixel electrode AE_3 of the light emitting element ED_3 has a flat surface and is in contact with the light emitting layer EL_3 to emit light. The inclined surface emission area may be an area in which the pixel electrode AE_3 has an inclined surface and is in contact with the light emitting layer EL_3 to emit light.

For example, as shown in FIG. 20, the first emission area EA1_3 may include a first inclined surface emission area EA1_3*a* and a first flat surface emission area EA1_3*b*, the second emission area EA2_3 may include a second inclined surface emission area EA2_3*a* and a second flat surface emission area EA2_3*b*, and the third emission area EA3_3 may include a third inclined surface emission area EA3_3*a* and a third flat surface emission area EA3_3*b*.

The structure of the light emitting element ED_3 in the first emission area EA1_3 is substantially the same as the structures of the light emitting elements ED_3 in the second emission area EA2_3 and the third emission area EA3_3. Therefore, in the following description, the structure of the light emitting element ED_3 in the first emission area EA1_3 will be mainly described, and the structures of the light emitting elements ED_3 in the second emission area EA2_3 and the third emission area EA3_3 will be omitted.

Referring to FIGS. 21 and 22, a thin film transistor layer TFTL_3 of the display device 10_3 according to an embodiment may include a second passivation layer PAS2_3 having a recess (or recessed portion) which has a shape recessed toward another side in the third direction DR3 in the region overlapping each of the emission areas EA1_3, EA2_3, and EA3_3. The recess (or recessed portion) may include an inclined portion providing an inclined surface and a flat portion disposed at a side thereof to provide (or include) a flat surface. For example, the inclined portion may be disposed at an edge of the flat portion. The inclined portion may form an inclination angle θ2 with the flat portion. A description thereof will be given below. The recess (or recessed portion) formed in the second passivation layer PAS2_3 may be formed by patterning the second passivation layer PAS2_3 by using a halftone mask.

The light emitting element ED_3 according to an embodiment may include the pixel electrode AE_3, the light emitting layer EL_3, and a common electrode CE_3 that have a bent shape along the profile (or shape) of the recess (or recessed portion) formed in the second passivation layer PAS2_3.

The pixel electrode AE_3 may include an inclined portion AE_3*a*, which is disposed (e.g., directly disposed) on the inclined portion of the second passivation layer PAS2_3 to provide (or include) an inclined surface, and a flat portion AE_3*b* which is disposed directly on the flat portion of the second passivation layer PAS2_3 to provide (or include) a flat surface. The inclined portion AE_3*a* of the pixel electrode AE_3 may form the inclination angle θ2 with the flat portion AE_3*b*.

The light emitting layer EL_3 may include an inclined portion EL_3*a*, which is disposed (e.g., directly disposed) on the inclined portion AE_3*a* of the pixel electrode AE_3 to provide (or include) an inclined surface, and a flat portion EL_3*b* which is disposed directly on the flat portion AE_3*b* of the pixel electrode AE_3 to provide (or include) a flat surface. The inclined portion EL_3*a* of the light emitting layer EL_3 may form the inclination angle θ2 with the flat portion EL_3*b*.

The common electrode CE_3 may include an inclined portion CE_3*a*, which is disposed (e.g., directly disposed) on the inclined portion EL_3*a* of the light emitting layer EL_3 to provide (or include) an inclined surface, and a flat portion CE_3*b* which is disposed directly on the flat portion EL_3*b* of the light emitting layer EL_3 to provide (or include) a flat surface. The inclined portion CE_3*a* of the common electrode CE_3 may form the inclination angle θ2 with the flat portion CE_3*b*.

The light emitting element ED_3 may include an inclined surface emission portion formed by the inclined portion AE_3*a* of the pixel electrode AE_3, the inclined portion EL_3*a* of the light emitting layer EL_3, and the inclined portion CE_3*a* of the common electrode CE_3, and a flat surface emission portion formed by the flat portion AE_3*b* of the pixel electrode AE_3, the flat portion EL_3*b* of the light emitting layer EL_3, and the flat portion CE_3*b* of the common electrode CE_3. The first inclined surface emission area EA1_3*a* of the first emission area EA1_3 may be an area that overlaps (e.g., completely overlaps) the inclined surface emission portion in the third direction DR3, and the first flat surface emission area EA1_3*b* may be an area that overlaps (e.g., completely overlaps) the flat surface emission portion in third directions DR3.

In the first inclined surface emission area EA1_3*a*, a first light LEa may be emitted from the inclined surface formed by the inclined portion AE_3*a* of the pixel electrode AE_3, the inclined portion EL_3*a* of the light emitting layer EL_3, and the inclined portion CE_3*a* of the common electrode CE_3.

In the first flat surface emission area EA1_3*b*, a second light LEb may be emitted from the flat surface formed by the flat portion AE_3*b* of the pixel electrode AE_3, the flat portion EL_3*b* of the light emitting layer EL_3, and the flat portion CE_3*b* of the common electrode CE_3.

According to the above-described configuration, since the light emitting element ED_3 according to an embodiment emits the first light LEa having a propagation path oblique to the third direction DR3 and the second light LEb having a propagation path parallel to the third direction DR3, the image may be viewed not only from the front surface of the display device 10_3 according to an embodiment but also from the side surface thereof.

Also, since the first light LEa is emitted in a direction parallel to a direction perpendicular to the inclined surface formed by the inclined portion AE_3*a* of the pixel electrode AE_3, the inclined portion EL_3*a* of the light emitting layer EL_3 and the inclined portion CE_3*a* of the common electrode CE_3, a viewing angle of the first light LEa with respect to the inclined surface may be 0°. Accordingly, as shown in the graph of FIG. 9, the luminance of light emitted to the side surface of the display device 10_3 may be increased to improve the side visibility.

An encapsulation layer TFEL_3 according to an embodiment may be disposed on the light emitting element ED_3. The encapsulation layer TFEL_3 may include the first encapsulation layer TFE1 disposed on the common electrode CE_3 and formed over the entire surface of the display area DA, a second encapsulation layer TFE2_3 disposed on the first encapsulation layer TFE1 and formed over the entire surface of the display area DA to planarize a step caused by the opening formed by the pixel defining layer PDL, and the third encapsulation layer TFE3 disposed on the second encapsulation layer TFE2_3 and formed over the entire surface of the display area DA. The first encapsulation layer TFE1 and the third encapsulation layer TFE3 may be spaced apart from each other with the second encapsulation layer TFE2_3 interposed therebetween not only at portions overlapping the emission areas EA1_3, EA2_3, and EA3_3, but also at a portion overlapping the pixel defining layer PDL.

The first light blocking layer BM1_3 according to an embodiment may be disposed on the third encapsulation layer TFE3, but embodiments are not limited thereto. FIG. 21 illustrates that the first light blocking layer BM1_3 is disposed directly on the third encapsulation layer TFE3.

The first light blocking layer BM1_3 may extend to the inclined surface emission area of each of the emission areas EA1_3, EA2_3, and EA3_3, and may not overlap the flat surface emission area thereof. For example, the first light blocking layer BM1_3 may extend to the first inclined surface emission area EA1_3*a* in the first emission area EA1_3 and may not overlap the first flat surface emission area EA1_3*b*. For example, an opening formed by the first light blocking layer BM1_3 may overlap (e.g., completely overlap) the first flat surface emission area EA1_3*b*, and a width w1_3 of the opening formed by the first light blocking layer BM1_3 may be substantially equal to the width w1_3 of the first flat surface emission area EA1_3*b*. For example, the width w1_3 of the opening formed by the first light blocking layer BM1_3 may be smaller than the width w3 of the opening formed by the pixel defining layer PDL. For example, the first light blocking layer BM1_3 may cover (e.g., completely cover) the pixel defining layer PDL. For example, since it is less necessary for the pixel defining layer PDL to include a light blocking material, the pixel defining layer PDL according to an embodiment may include a transparent organic material.

A first overcoat layer OC1_3 may be disposed on the first light blocking layer BM1_3. The first overcoat layer OC1_3 may function to planarize a step generated by the first light blocking layer BM1_3.

As described above, since the light emitting element ED_3 according to an embodiment emits the first light LEa having a propagation path oblique to the third direction DR3, the first light LEa may pass through the opening formed by the first light blocking layer BM1_3 to be recognized by the user even in case that the first light blocking layer BM1_3 blocks the inclined surface emission area in the third direction DR3. Accordingly, the display device 10_3 according to an embodiment may be capable of improving the side visibility with increasing the area of the first light blocking layer BM1_3.

Figure 23:
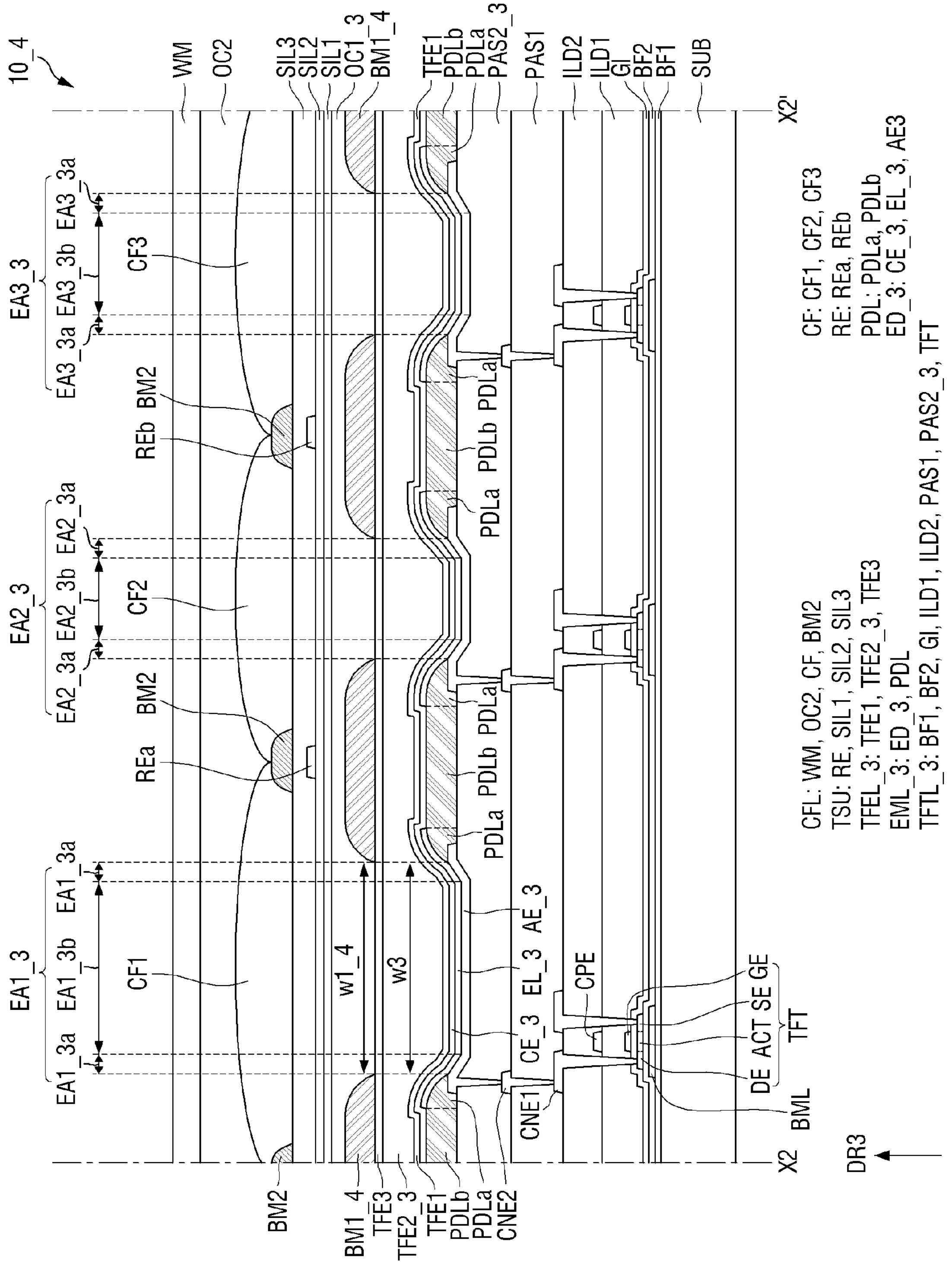
FIG. 23 is a schematic cross-sectional view illustrating a pixel structure of a display device according to still another embodiment.

FIG. 23 is a schematic cross-sectional view illustrating a pixel structure of a display device according to still another embodiment.

Referring to FIG. 23, a display device 10_4 according to an embodiment is illustrated, in which a width of an opening of a first light blocking layer BM1_4 may be adjusted, differently from the display device 10_3 according to the embodiment of FIG. 21. For example, the first light blocking layer BM1_4 may extend to each of the emission areas EA1_3, EA2_3, and EA3_3, and may overlap (e.g., completely overlap) the pixel defining layer PDL in the third direction DR3, but embodiments are not limited thereto. FIG. 23 illustrates that the first light blocking layer BM1_4 extends to each of the emission areas EA1_3, EA2_3, and EA3_3.

The area (or size) of the first light blocking layer BM1_4 may be formed to be smaller the areas (or size) that of the first light blocking layer BM1_3 of the display device 10_3 according to the embodiment of FIG. 21, thereby further improving the side visibility of the display device 10_4.

Figure 24:
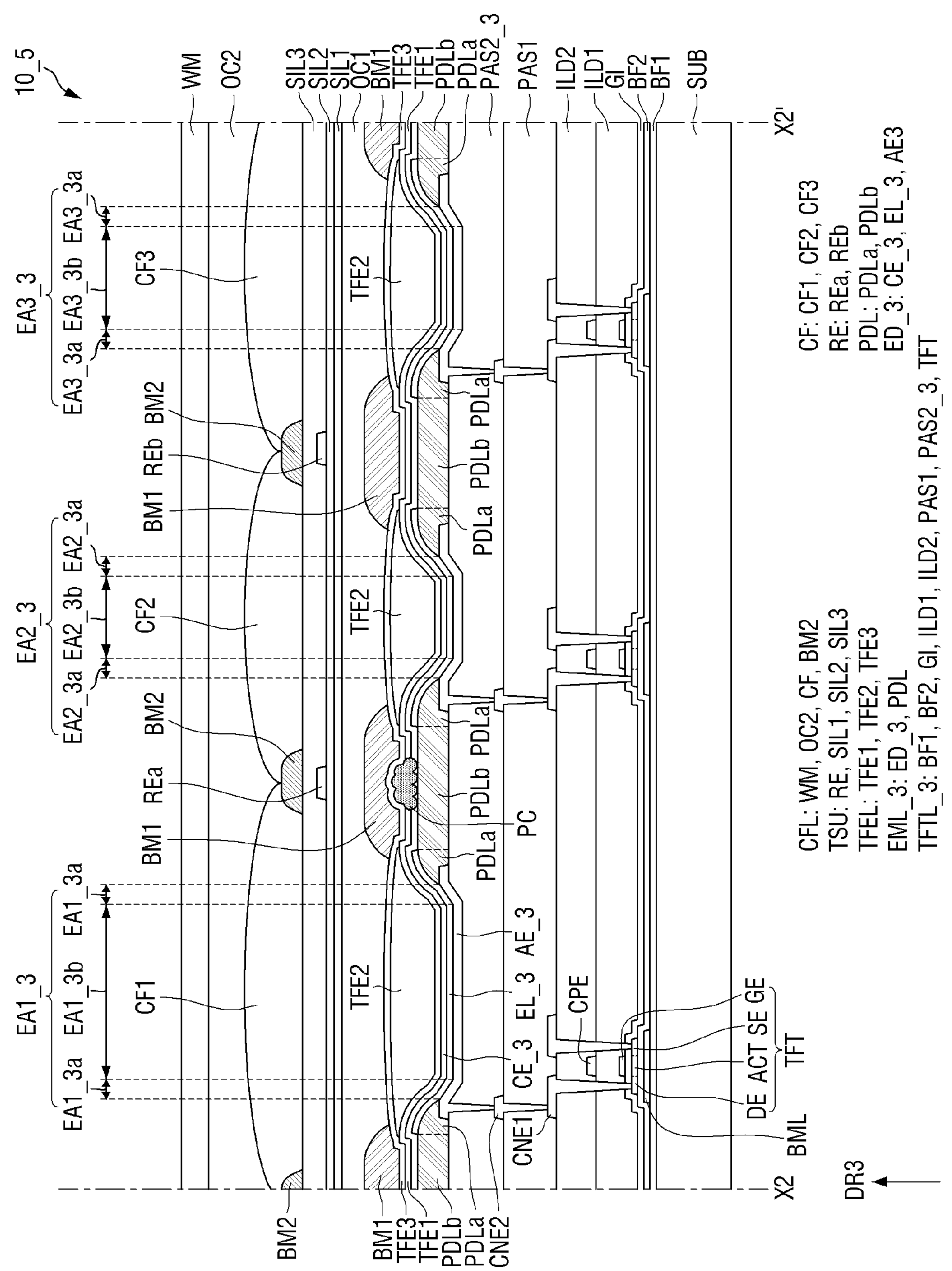
FIG. 24 is a schematic cross-sectional view illustrating a pixel structure of a display device according to still another embodiment.

FIG. 24 is a schematic cross-sectional view illustrating a pixel structure of a display device according to still another embodiment.

Referring to FIG. 24, it is illustrated that a display device 10_5 according to an embodiment may include the light emitting element ED_3 having a bent shape, and the second encapsulation layer TFE2 of the encapsulation layer TFEL may be separately disposed in an emission area.

For example, the light emitting element ED_3 of the display device 10_5 according to an embodiment may be substantially the same as the light emitting element ED_3 of the display device 10_3 according to the embodiment of FIG. 22, and the encapsulation layer TFEL of the display device 10_5 according to an embodiment may be substantially the same as the encapsulation layer TFEL of the display device 10 according to an embodiment. Also, the first light blocking layer BM1 of the display device 10_5 according to an embodiment may be substantially the same as the first light blocking layer BM1 of the display device 10 according to an embodiment.

A description of the light emitting element ED_3, the encapsulation layer TFEL and the first light blocking layer BM1 is the same as the above description, and thus the description thereof will be omitted.

With the above-described configuration, the display device 10_5 according to an embodiment is capable of decreasing the thickness of the display panel itself by decreasing the thickness of the encapsulation layer TFEL, effectively encapsulating the organic particles PC that is generated during the manufacturing process, and further improving the side visibility of the display device 10_5 due to the shape of the bent light emitting element ED_3.

Figure 25:
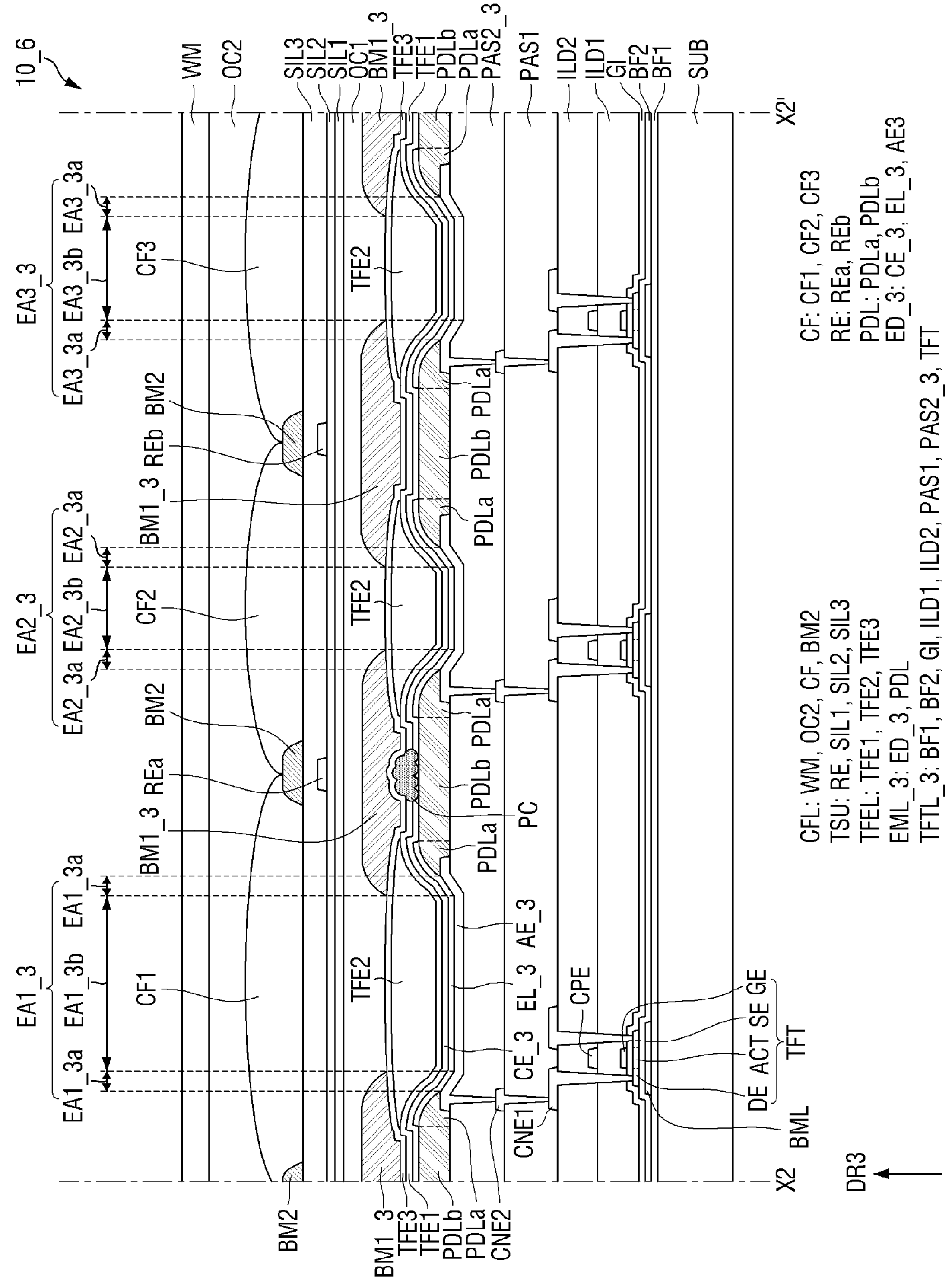
FIG. 25 is a schematic cross-sectional view illustrating a pixel structure of a display device according to still another embodiment.

FIG. 25 is a schematic cross-sectional view illustrating a pixel structure of a display device according to still another embodiment.

Referring to FIG. 25, it is illustrated that the display device 10_6 according to an embodiment may include the first light blocking layer BM1_3 having a relatively larger area compared to that of the first light blocking layer BM1 of the display device 10_5 according to the embodiment of FIG. 24.

For example, the first light blocking layer BM1_3 of the display device 10_6 according to an embodiment may be substantially the same as the first light blocking layer BM1_3 of the display device 10_3 according to the embodiment of FIG. 21. Since a description of the first light blocking layer BM1_3 is the same as the above description, the description thereof will be omitted.

With the above-described configuration, the display device 10_6 according to an embodiment is capable of decreasing the thickness of the display panel itself by decreasing the thickness of the encapsulation layer TFEL, effectively encapsulating the organic particles PC that is generated during the manufacturing process, further improving the side visibility of the display device 10_6 due to the shape of the bent light emitting element ED_3, and improving external light reflectance by increasing the area of the first light blocking layer BM1_3.

Figure 26:
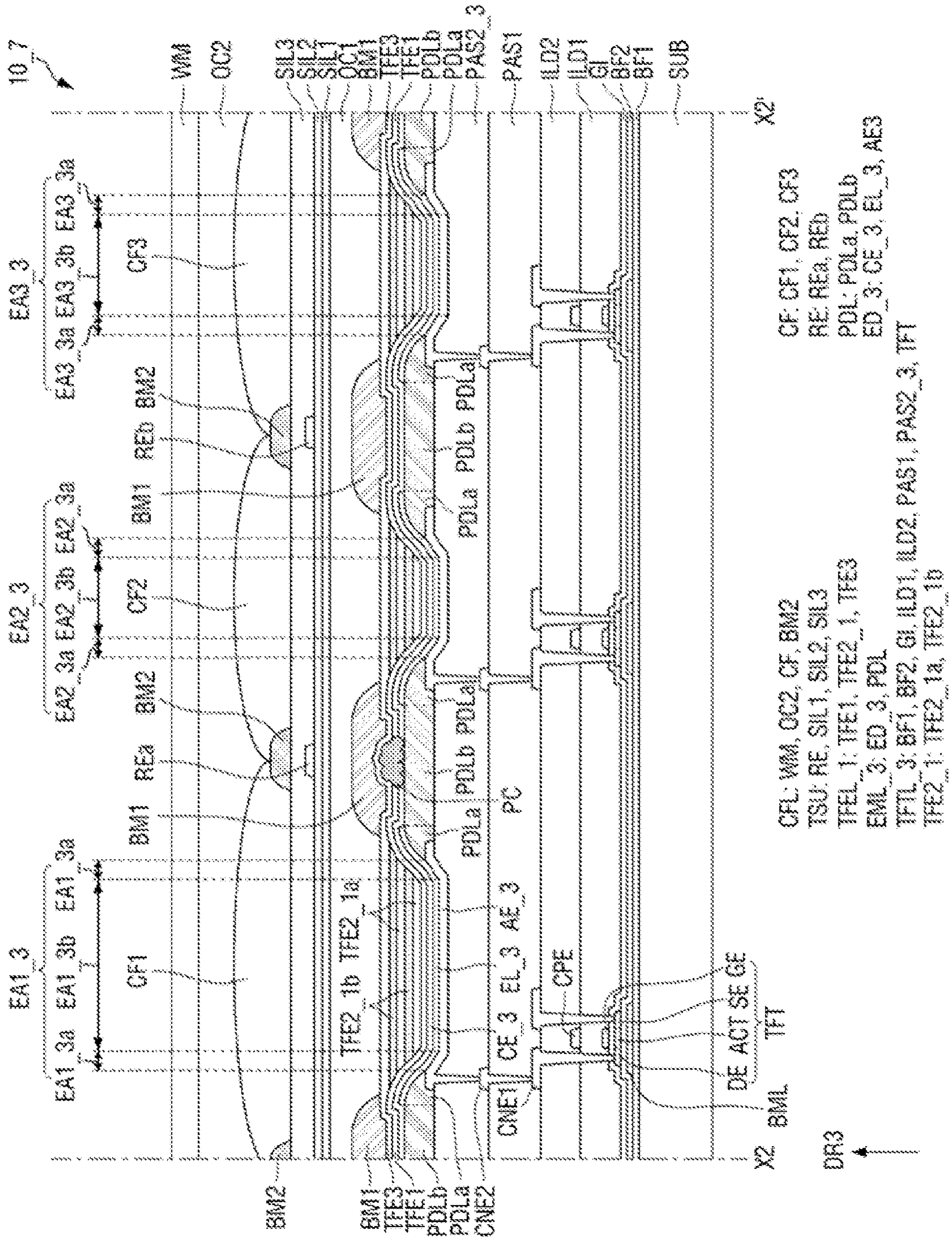
FIG. 26 is a schematic cross-sectional view illustrating a pixel structure of a display device according to still another embodiment.

FIG. 26 is a schematic cross-sectional view illustrating a pixel structure of a display device according to still another embodiment.

Referring to FIG. 26, a display device 10_7 according to an embodiment is different from the display device 10_5 according to the embodiment of FIG. 24 in that the second encapsulation layer TFE2_1 of the encapsulation layer TFEL_1 may have a structure in which layers are alternately stacked. Other configurations of the display device 10_7 are substantially the same as or similar to those of the display device 10_5.

For example, the second encapsulation layer TFE2_1 of the display device 10_7 according to an embodiment may be substantially the same as the second encapsulation layer TFE2_1 of the display device 10_1 according to the embodiment of FIG. 18. Since a description of the second encapsulation layer TFE2_1 is the same as the above description, the description thereof will be omitted.

Figure 27:
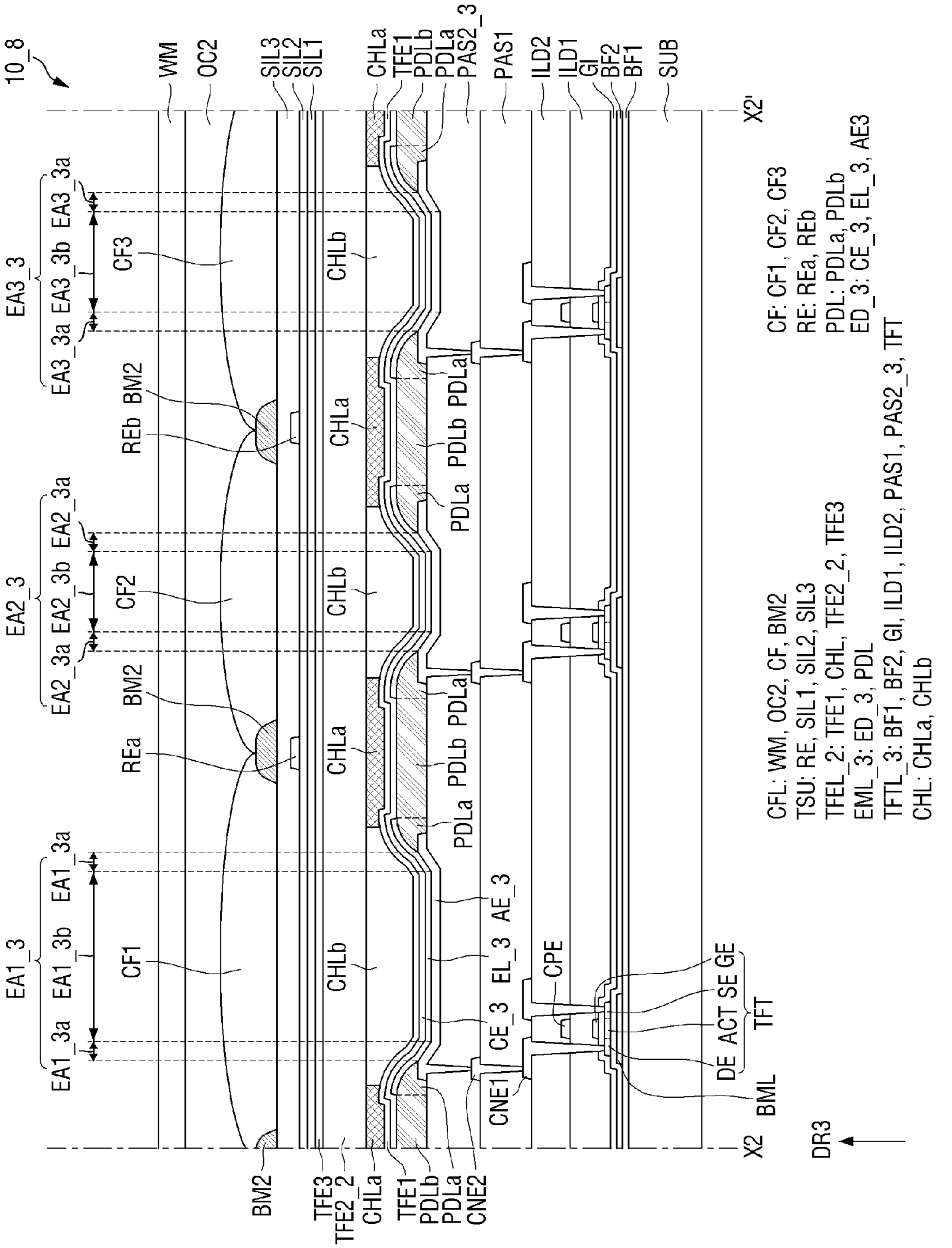
FIG. 27 is a schematic cross-sectional view illustrating a pixel structure of a display device according to still another embodiment.

FIG. 27 is a schematic cross-sectional view illustrating a pixel structure of a display device according to still another embodiment.

Referring to FIG. 27, a display device 10_8 according to an embodiment is different from the display device 10_5 according to the embodiment of FIG. 24 in that the encapsulation layer TFEL_2 may include the color change layer CHL. Other configurations of the display device 10_8 are substantially the same as or similar to those of the display device 10_5.

For example, the encapsulation layer TFEL_2 of the display device 10_8 according to an embodiment may be substantially the same as the encapsulation layer TFEL_2 of the display device 10_2 according to the embodiment of FIG. 19. Since a description of the encapsulation layer TFEL_2 is the same as the above description, the description thereof will be omitted.

Figure 28:
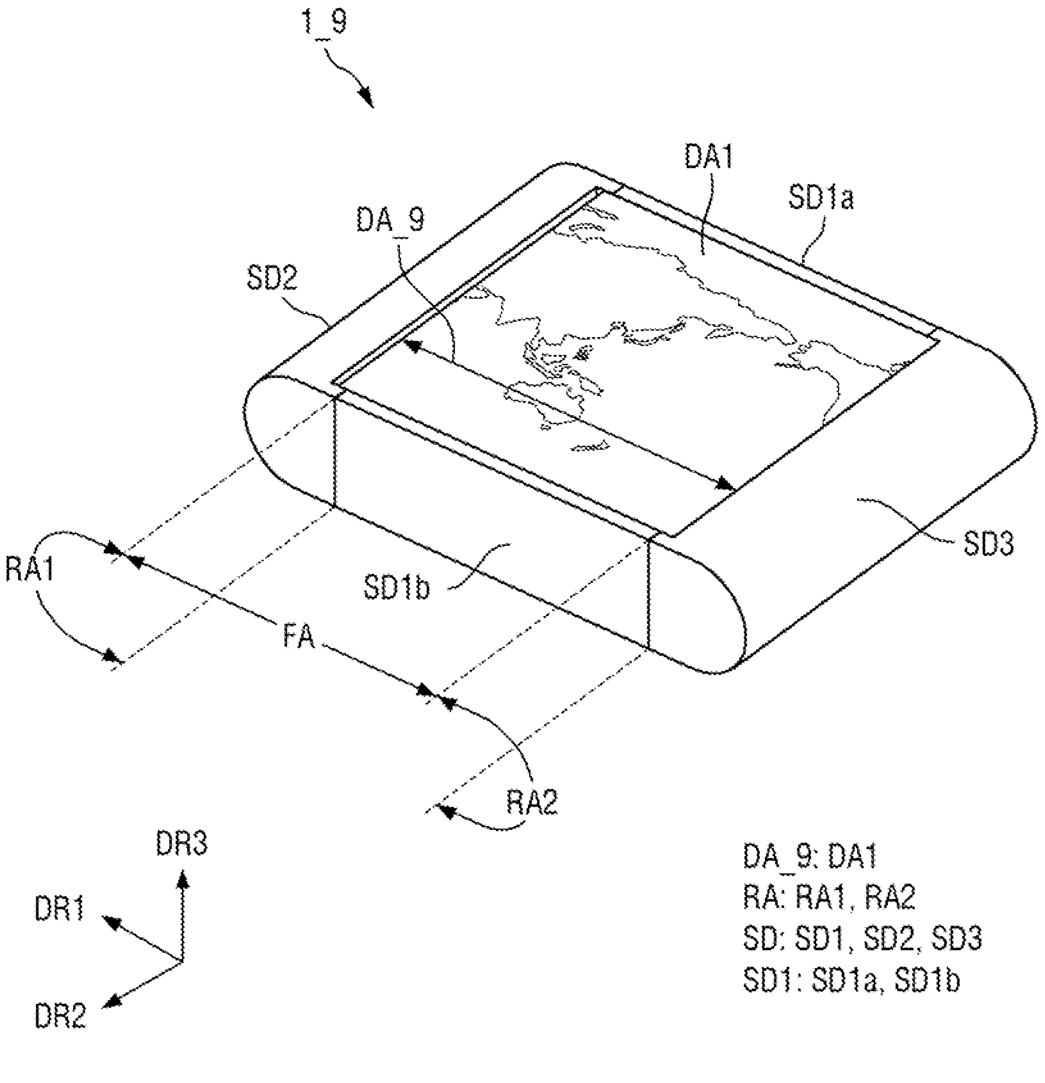
FIG. 28 is a schematic perspective view of an electronic device according to another embodiment.
Figure 29:
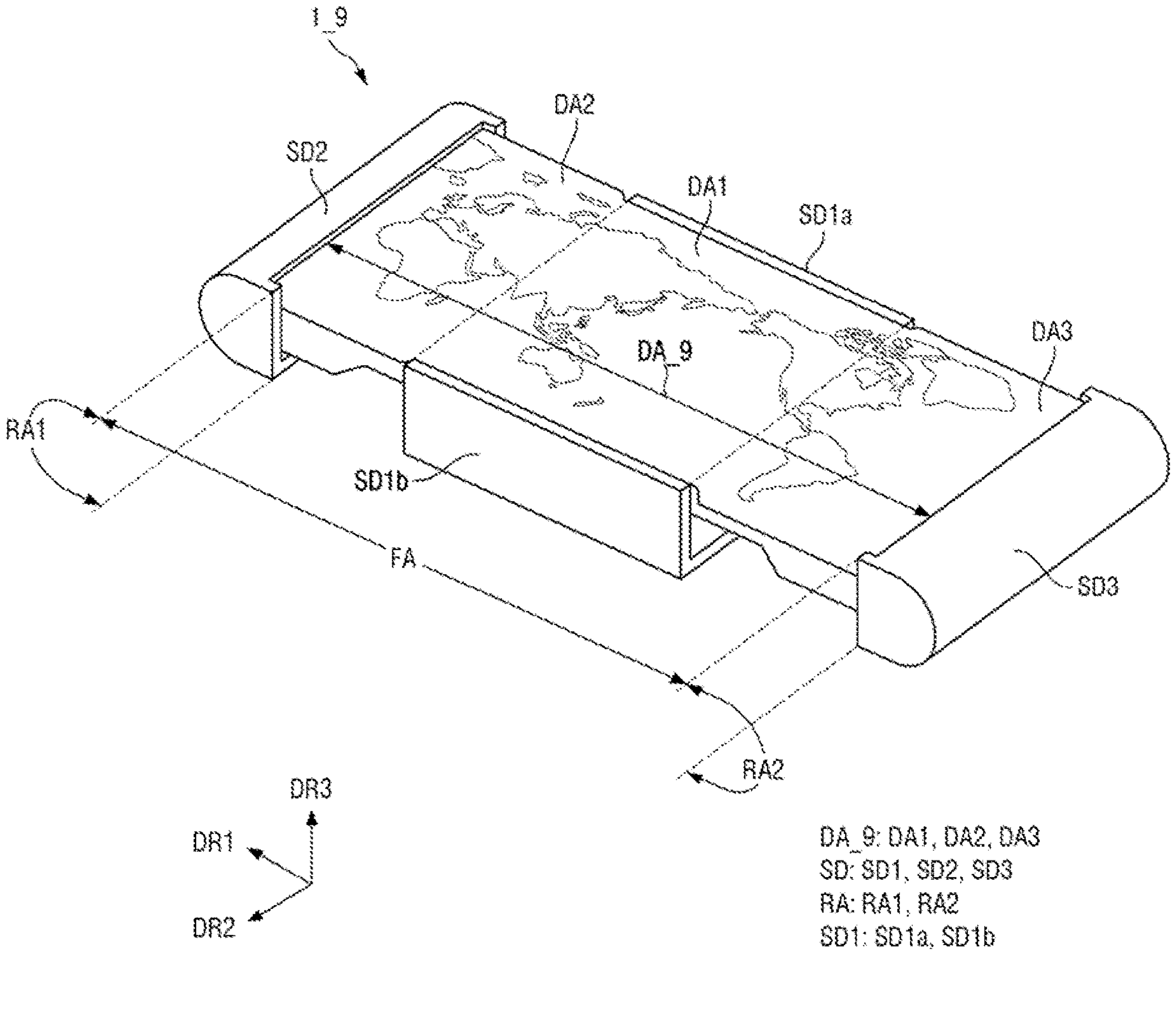
FIG. 29 is a schematic perspective view illustrating an expanded state of the electronic device of FIG. 28.
Figure 30:
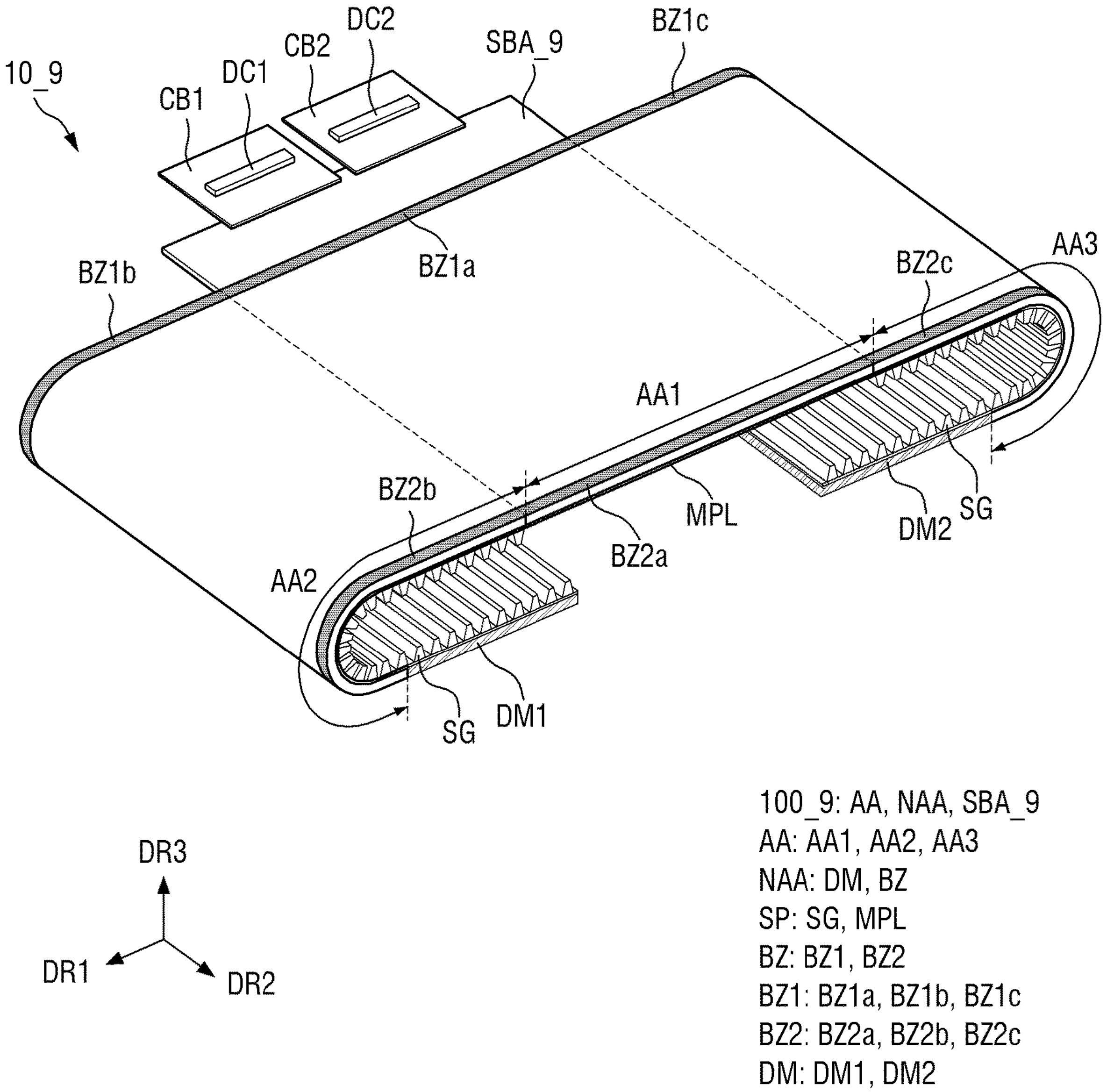
FIG. 30 is a schematic perspective view of a display device included in the electronic device of FIG. 28.
Figure 31:
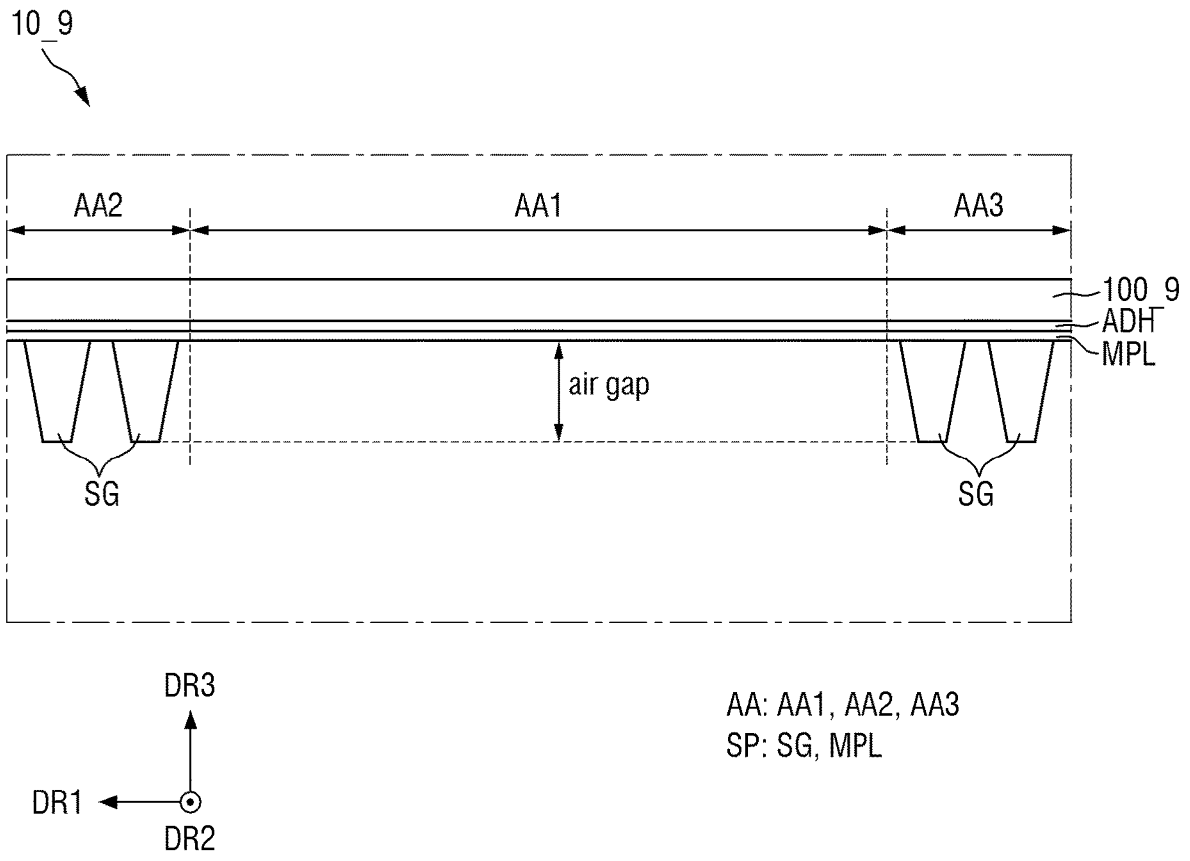
FIG. 31 is a schematic cross-sectional view of the display device of FIG. 30 viewed from the side.

FIG. 28 is a schematic perspective view of an electronic device according to another embodiment. FIG. 29 is a perspective view illustrating an expanded state of the electronic device of FIG. 28. FIG. 30 is a schematic perspective view of a display device included in the electronic device of FIG. 28. FIG. 31 is a schematic cross-sectional view of the display device of FIG. 30 viewed from the side.

Referring to FIGS. 28 to 31, an electronic device 1_9 according to an embodiment may be a sliding display device or a slidable electronic device that is slidable in the first direction DR1. The electronic device 1_9 according to an embodiment may be a multi-slidable electronic device that slides in directions (e.g., opposite directions), but embodiments are not limited thereto. For example, the electronic device 1_9 may be a single slidable electronic device that slides in only one direction. Hereinafter, the electronic device 1_9 according to an embodiment will be mainly described as a multi-slidable electronic device.

The electronic device 1_9 may include a flat area FA and a bending area RA. The flat area FA of the electronic device 1_9 substantially overlaps an area that exposes a display panel 100_9 of a panel storage container SD, which will be described below. The bending area RA of the electronic device 1_9 may be formed in the panel storage container SD. The bending area RA may be bent with a predetermined radius of curvature, and may be an area in which the display panel 100_9 is bent according to the radius of curvature. The bending areas RA may be disposed on both sides of the flat area FA in the first direction DR1. For example, a first bending area RA1 may be disposed on another side of the flat area FA in the first direction DR1 and a second bending area RA2 may be disposed on a side of the flat area FA in the first direction DR1. The first bending area RA1 may be an area in which a second active region AA2 of the display panel 100_9, which will be described below, is bent. The second bending area RA2 may be an area in which a third active region AA3 of the display panel, which will be described below, is bent. As illustrated in FIG. 29, the size of the flat area FA may increase as the electronic device 1_9 expands. Accordingly, a distance between the first bending area RA1 and the second bending area RA2 may be increased.

The electronic device 1_9 according to an embodiment may include a display device 10_9. The display device 10_9 may include the display panel 100_9, a panel supporter SP, and the panel storage container SD.

The display panel 100_9 may be a panel for displaying an image, and any type of display panel such as an organic light emitting display panel including an organic light emitting layer, a micro light emitting diode display panel including a micro light emitting diode (LED), a quantum dot light emitting display panel including a quantum dot light emitting diode including a quantum dot light emitting layer, or an inorganic light emitting display panel including an inorganic light emitting element including an inorganic semiconductor may be applied to the display panel 100_9 according to an embodiment.

The display panel 100_9 according to an embodiment may have any one of the structure of the display panel of the display device 10 according to the embodiment of FIG. 8, the structure of the display panel of the display device 10_1 according to the embodiment of FIG. 18, the structure of the display panel of the display device 10_2 according to the embodiment of FIG. 19, the structure of the display panel of the display device 10_3 according to the embodiment of FIG. 21, the structure of the display panel of the display device 10_4 according to the embodiment of FIG. 23, the structure of the display panel of the display device 10_5 according to the embodiment of FIG. 24, the structure of the display panel of the display device 10_6 according to the embodiment of FIG. 25, the structure of the display panel of the display device 10_7 according to the embodiment of FIG. 26, and the structure of the display panel of the display device 10_8 according to the embodiment of FIG. 27.

The display panel 100_9 may be a flexible panel. The display panel 100_9 may have flexibility to be partially rolled, bent, or curved in the panel storage container SD, as will be described below. The display panel 100_9 may be slid in the first direction DR1.

The display panel 100_9 may include an active region AA and a non-active region NAA.

The active region AA of the display panel 100_9 may be a region in which pixels PX are disposed. The active region AA may include the first active region AA1 supported only by a main plate MPL, which will be described below, and the second active region AA2 and the third active region AA3 that are supported by the main plate MPL and segments SG. The first active region AA1 of the display panel 100_9 may be a continuously flat region capable of maintaining a flat shape regardless of a sliding operation.

The second active region AA2 and the third active region AA3 of the display panel 100_9 may be a bending region or a bendable region, which is rolled, bent, or curved, or which is transformed between a rolled, bent, or curved shape and a flat shape according to the sliding operation of the electronic device 1_9. The second active region AA2 and the third active region AA3 of the display panel 100_9 may be bent by a roller.

The display area DA of the display panel 100_9 may be an area in which an image is displayed. The display area DA may be divided into a first display area DA1, a second display area DA2, and a third display area DA3 according to whether the display panel 100_9 slides or the sliding degree of the display panel 100_9. The presence and size of the second display area DA2 and the third display area DA3 may vary according to whether the display panel 100_9 slides or the sliding degree of the display panel 100_9. For example, in a non-sliding state, the display panel 100_9 has the first display area DA1 having a first size. In a sliding state, the display area DA may further include the second display area DA2 and the third display area DA3 expanded in addition to the first display area DA1.

The first display area DA1 may overlap the first active region AA1 of the display panel 100_9. The second display area DA2 may overlap at least a part of the second active region AA2 of the display panel 100_9. The third display area DA3 may overlap at least a part of the third active region AA3 of the display panel 100_9. For example, the second display area DA2 may be an area in which the flat area FA and the second active region AA2 of the display panel 100_9 overlap each other, and the third display area DA3 may be an area in which the flat area FA and the third active region AA3 of the display panel 100_9 overlap each other.

In some embodiments, the boundary between the first display area DA1 and the second display area DA2 may coincide with the boundary between the first active region AA1 and the second active region AA2, and the boundary between the first display area DA1 and the third display area DA3 may coincide with the boundary between the first active region AA1 and the third active region AA3, but embodiments are not limited thereto.

The sizes of the second display area DA2 and the third display area DA3 may vary according to the degree of sliding. For example, in a state in which the electronic device 1_9 is slid to the maximum, the second display area DA2 may have a second size, the third display area DA3 may have a third size, and the display area DA may have a fourth size that is the sum of the first area, the second area, and the third area. For example, the fourth area may be a maximum area that the display area DA may have.

The non-active region NAA of the display panel 100_9 may be an area in which no pixel is disposed. Metal lines such as data/scan lines, touch lines, or power voltage lines may be disposed in the non-active region NAA. The non-active region NAA may include a bezel area BZ and a dummy area DM. The non-active region NAA may surround the active region AA.

The bezel areas BZ may be disposed at end portions (e.g., opposite end portions) of the active region AA in the second direction DR2 as shown in FIG. 30. For example, the bezel areas BZ may include a first bezel area BZ1 disposed at an end portion of the active region AA in the second direction DR2 and a second bezel area BZ2 disposed at another end portion of the active region AA in the second direction DR2.

The first bezel area BZ1 may include a first portion BZ1*a* that is a portion overlapping the first active region AA1 in the second direction DR2, a second portion BZ1*b* that is a portion overlapping the second active region AA2 in the second direction DR2, and a third portion BZ1*c* that is a portion overlapping the third active region AA3 in the second direction DR2. As described above, the first active region AA1 is the continuously flat region, and the first portion BZ1*a* of the first bezel area BZ1 may also be a continuously flat region. For example, the second active region AA2 and the third active region AA3 may be the bendable regions, and the second portion BZ1*b* and the third portion BZ1*c* of the first bezel area BZ1 may also be bendable regions.

The second bezel area BZ2 may include a first portion BZ2*a* that is a portion overlapping the first active region AA1 in the second direction DR2, a second portion BZ2*b* that is a portion overlapping the second active region AA2 in the second direction DR2, and a third portion BZ2*c* that is a portion overlapping the third active region AA3 in the second direction DR2. As described above, the first active region AA1 may be the continuously flat region, and the first portion BZ2*a* of the second bezel area BZ2 may also be a continuously flat region. For example, the second active region AA2 and the third active region AA3 may be the bendable regions, and the second portion BZ2*b* and the third portion BZ2*c* of the second bezel area BZ2 may also be bendable regions.

The dummy areas DM may be disposed at end portions (e.g., opposite end portions) of the active region AA in the first direction DR1 as shown in FIGS. 3 and 5. For example, one of the dummy areas DM disposed at the end portion of the second active region AA2 in the first direction DR1 may be referred to as a first dummy area DM1, and the other disposed at the end portion of the third active region AA3 in the first direction DR1 may be referred to as a second dummy area DM2.

The dummy area DM may be slid or bent according to the operation of the electronic device 1_9. For example, the dummy area DM may be included in the bendable region of the display panel 100_9. For example, the end portion of the dummy area DM that is not adjacent to the second active region AA2 or the third active region AA3 may be an end portion of the bending region or the bendable region of the display panel 100_9. In some embodiments, the dummy area DM may be supported by the segments SG, but embodiments are not limited thereto.

The display panel 100_9 may further include a sub-region SBA_9. The sub-region SBA_9 may be disposed on another side of the first active region AA1 of the display panel 100_9 in the second direction DR2. For example, the sub-region SBA_9 may protrude from the non-active region NAA to another side in the second direction DR2.

The sub-region SBA_9 may overlap the first active region AA1 in the second direction DR2 and may not overlap the second active region AA2 and the third active region AA3 in the second direction DR2.

In some embodiments, the sub-region SBA_9 may have a rectangular shape in plan view, but embodiments are not limited thereto. In some embodiments, the length of the sub-region SBA_9 in the first direction DR1 may be substantially the same as the length of the first active region AA1 in the first direction DR1, but embodiments are not limited thereto. In another example, the length of the sub-region SBA_9 in the first direction DR1 may be smaller than the length of the first active region AA1 in the first direction DR1. The length of the sub-region SBA_9 in the second direction DR2 may be smaller than the length of the first active region AA1 in the second direction DR2.

The sub-region SBA_9 may be a region that is bent or curved. In case that the sub-region SBA_9 is bent, the sub-region SBA_9 may be disposed in a space formed by bending the second active region AA2 and the third active region AA3 of the display panel 100_9 to overlap the first active region AA1 in the third direction DR3. With the above-described configuration, the electronic device 1_9 according to an embodiment may be capable of maximizing the internal space with minimizing the thickness that is increased by bending the display panel 100_9.

A first driving circuit DC1 and a first circuit board CB1, and a second driving circuit DC2 and a second circuit board CB2 may be disposed on a surface of the sub-region SBA_9 in the third direction DR3.

The first circuit board CB1 and the second circuit board CB2 may be attached onto the top surface of the sub-region SBA_9 via an anisotropic conductive film (ACF). The first circuit board CB1 and the second circuit board CB2 may be electrically connected to a pad portion formed on the sub-region SBA_9. The first circuit board CB1 and the second circuit board CB2 may be a flexible film such as a chip on film, a flexible printed circuit board, or a printed circuit board.

The first driving circuit DC1 and the second driving circuit DC2 may be formed as an integrated circuit (IC) and attached onto the sub-region SBA_9 by a chip on glass (COG) method, a chip on plastic (COP) method, or an ultrasonic bonding method. In another example, the first driving circuit DC1 and the second driving circuit DC2 may be attached onto the first circuit board CB1 and the second circuit board CB2, respectively. FIG. 30 illustrates that the first driving circuit DC1 is attached onto the first circuit board CB1, the second driving circuit DC2 may be attached onto the second circuit board CB2, the first circuit board CB1 and the second circuit board CB2 may be spaced apart from each other, and the first driving circuit DC1 and the second driving circuit DC2 may be spaced apart from each other in the first direction DR1.

The panel supporter SP may function to support the bottom surface of the display panel 100_9. The panel supporter SP may be attached to the bottom surface of the display panel 100_9 to support the display panel 100_9.

An adhesive ADH may be interposed between the panel supporter SP and the display panel 100_9. In some embodiments, the adhesive ADH may be a pressure sensitive adhesive (PSA), but embodiments are not limited thereto. The panel supporter SP may include the main plate MPL and the segments SG.

The main plate MPL may function to support the bottom surface of the display panel 100_9. For example, the main plate MPL may support not only the first active region AA1, the second active region AA2, and the third active region AA3 of the display panel 100_9, but also the bezel area BZ and the dummy area DM surrounding them.

The main plate MPL may be patterned to ensure a bending property in a portion supporting the second active region AA2 and a portion supporting the third active region AA3.

The main plate MPL may have a planar shape extending in the first direction DR1 and the second direction DR2. For example, the main plate MPL may have a substantially flat shape in plan view. The main plate MPL may have the same thickness in the third direction DR3 along the profile (or shape) of the display panel 100_9.

The segments SG may function to support the second active region AA2 and the third active region AA3 of the display panel 100_9. For example, the segments SG may support not only the second active region AA2 and the third active region AA3 of the display panel 100_9 but also the second portion BZ1*b* and the third portion BZ1*c* of the first bezel area BZ1, the second portion BZ2*b* and the third portion BZ2*c* of the second bezel area BZ2, and the dummy area DM that surround the second active region AA2 and the third active region AA3. The segments SG may be disposed on the bottom surface of the main plate MPL.

The segments SG may be arranged to extend in the second direction DR2 with being spaced apart from each other in the first direction DR1. Since the segments SG are not disposed in the first active region AA1, an air gap may be formed under a part of the main plate MPL, which supports the first active region AA1, as shown in FIG. 31. As the air gap is formed under the main plate MPL, an impact applied to the display panel 100_9 may be alleviated. For example, in case that an object such as a user's pen falls into the first active region AA1 of the display panel 100_9, the air gap may absorb the corresponding impact.

The main plate MPL and the segments SG may have substantially the same relative positional relationship with respect to the display panel 100_9. For example, in case that the display panel 100_9 is stretched to be flat without being bent, at least one plane parallel to the display panel 100_9 may pass through the main plate MPL and the segments SG simultaneously.

As shown in FIGS. 28 and 29, the panel storage container SD may accommodate at least a part of the display panel 100_9, and may have a function of assisting the sliding operation of the electronic device 1_9. The panel storage container SD may include a first storage container SD1 located at the center portion of the electronic device 1_9, a second storage container SD2 that is disposed at a side of the first storage container SD1 in the first direction DR1 and has the first bending area RA1, and a third storage container SD3 that is disposed at another side of the first storage container SD1 in the first direction DR1 and has a second bending area RA2.

The first storage container SD1 may connect the second storage container SD2 and the third storage container SD3 to each other. For example, the first storage container SD1 may include a first_first storage container SD1*a*, which connects another side of the second storage container SD2 in the second direction DR2 and another side of the third storage container SD3 in the second direction DR2, and a first_second storage container SD1*b* which connects a side of the second storage container SD2 in the second direction DR2 and a side of the third storage container SD3 in the second direction DR2.

In some embodiments, rails may be formed in the second storage container SD2 and the third storage container SD3 to guide the sliding operation of the display panel 100_9, but embodiments are not limited thereto.

As described above, in case that the electronic device 1_9 is implemented as a slidable electronic device, the structure of the display panel 100_9 included in the electronic device 1_9 may be any one of the structure of the display panel of the display device 10 according to the embodiment of FIG. 8, the structure of the display panel of the display device 10_1 according to the embodiment of FIG. 18, the structure of the display panel of the display device 10_2 according to the embodiment of FIG. 19, the structure of the display panel of the display device 10_3 according to the embodiment of FIG. 21, the structure of the display panel of the display device 10_4 according to the embodiment of FIG. 23, the structure of the display panel of the display device 10_5 according to the embodiment of FIG. 24, the structure of the display panel of the display device 10_6 according to the embodiment of FIG. 25, the structure of the display panel of the display device 10_7 according to the embodiment of FIG. 26, and the structure of the display panel of the display device 10_8 according to the embodiment of FIG. 27. Accordingly, as the thickness of the display panel is decreased, the flexibility of the display panel required for the slidable electronic device may be improved, and the side visibility and reflectance of the display panel may be improved, so that the screen of the slidable electronic device may be clear.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:

a via insulating layer disposed on a first surface of a substrate;

a first electrode disposed on the via insulating layer;

a pixel defining layer comprising:

an inclined region disposed on the first electrode and including a first opening exposing a portion of the first electrode, and a flat region disposed at a side of the inclined region and in contact with the via insulating layer;

a light emitting layer disposed on the portion of the first electrode exposed by the first opening;

organic particles disposed on the flat region of the pixel defining layer;

an encapsulation layer covering the pixel defining layer, the light emitting layer, and the organic particles, and comprising a first layer, a second layer, and a third layer which are sequentially stacked; and a first light blocking layer disposed on the third layer of the encapsulation layer to overlap the flat region of the pixel defining layer and form a second opening, wherein the second layer of the encapsulation layer is disposed between the first layer and the third layer and overlaps the second opening, and the first layer and the third layer of the encapsulation layer are in contact with each other at an overlap with the first light blocking layer and the pixel defining layer.

2. The display device of claim 1, further comprising:

a second electrode disposed between the first layer of the encapsulation layer and the light emitting layer, wherein the organic particles penetrate the second electrode and the first layer.

3. The display device of claim 2, wherein the third layer surrounds the organic particles.

4. The display device of claim 3, wherein the organic particles and the light emitting layer include a same material.

5. The display device of claim 1, wherein a width of the second opening is greater than a width of the first opening.

6. The display device of claim 5, further comprising:

a first overcoat layer disposed on the first light blocking layer; and a touch electrode layer disposed on the first overcoat layer, wherein a dielectric constant of the first overcoat layer has a value lower than a dielectric constant of the second layer of the encapsulation layer.

7. The display device of claim 6, further comprising:

a second light blocking layer disposed on the touch electrode layer and including a third opening; and a color filter covering the third opening, wherein a width of the third opening is greater than the width of the second opening.

8. The display device of claim 7, wherein the touch electrode layer comprises a touch electrode, and the second light blocking layer overlaps the touch electrode.

9. The display device of claim 8, wherein the pixel defining layer includes a light blocking material.

10. The display device of claim 1, wherein the second layer of the encapsulation layer comprises a first material layer and a second material layer which are alternately and repeatedly disposed.

11. The display device of claim 10, wherein one of the first material layer and the second material layer includes silicon oxycarbide (SiOC), and another one of the first material layer and the second material layer includes silicon nitride ($SiN_x$).

12. The display device of claim 1, wherein the substrate is configured to slide over a roller in a first direction, and the display device further comprises a plurality of segments extending in a second direction intersecting the first direction, the plurality of segments disposed on a second surface opposite to the first surface of the substrate.

* * * * *